(12) United States Patent
Kim et al.

(10) Patent No.: US 11,626,413 B2
(45) Date of Patent: Apr. 11, 2023

(54) SEMICONDUCTOR DEVICE INCLUDING GATE LAYER AND VERTICAL STRUCTURE

(71) Applicant: SAMSUNG ELECTRONICS CO., LTD., Suwon-si (KR)

(72) Inventors: Junhyoung Kim, Suwon-si (KR); Jisung Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/749,486

(22) Filed: May 20, 2022

(65) Prior Publication Data

US 2022/0278118 A1  Sep. 1, 2022

Related U.S. Application Data

(63) Continuation of application No. 16/835,559, filed on Mar. 31, 2020, now Pat. No. 11,342,346.

(30) Foreign Application Priority Data

Jul. 5, 2019  (KR) .......................... 10-2019-0081435

(51) Int. Cl.
| | | |
|---|---|---|
| H01L 27/11582 | (2017.01) | |
| H01L 27/11575 | (2017.01) | |
| H01L 27/11524 | (2017.01) | |
| H01L 27/11548 | (2017.01) | |
| H01L 27/1157  | (2017.01) | |

(52) U.S. Cl.
CPC .... H01L 27/11524 (2013.01); H01L 27/1157 (2013.01); H01L 27/11548 (2013.01); H01L 27/11575 (2013.01); H01L 27/11582 (2013.01)

(58) Field of Classification Search
CPC ................... H01L 27/11575; H01L 27/11582
See application file for complete search history.

(56) References Cited

U.S. PATENT DOCUMENTS

| | | |
|---|---|---|
| 9,735,170 B2 | 8/2017 | Chae et al. |
| 9,831,261 B2 | 11/2017 | Noda |
| 9,972,640 B1 | 5/2018 | Kai et al. |
| 10,199,511 B1 | 2/2019 | Nakaki |
| 10,224,240 B1 | 3/2019 | Funayama et al. |
| 2018/0277564 A1 | 9/2018 | Sugiura |

(Continued)

FOREIGN PATENT DOCUMENTS

KR  10-2020-0000241 A  1/2020

*Primary Examiner* — Robert G Bachner
*Assistant Examiner* — Molly K Reida
(74) *Attorney, Agent, or Firm* — Lee IP Law, P.C.

(57) ABSTRACT

A semiconductor device including vertical structures on a substrate; and interlayer insulating layers and gate layers on the substrate, wherein the gate layers are sequentially stacked in a memory cell array area and extend into an extension area, the gate layers have pad regions having a staircase structure in the extension area, the first vertical structure has a surface facing the gate layers, the second vertical structure has a surface facing at least one of the gate layers, the first vertical structure includes a first core pattern, a first semiconductor layer, and a pad pattern, the second vertical structure includes a second core pattern and a second semiconductor layer, each of the core patterns includes an insulating material, and an upper surface of the second semiconductor layer and an upper surface of the second core pattern are farther from the substrate than the upper surface of the first core pattern.

20 Claims, 24 Drawing Sheets

(56) References Cited

U.S. PATENT DOCUMENTS

| | | |
|---|---|---|
| 2019/0035804 A1 | 1/2019 | Kim et al. |
| 2019/0081064 A1 | 3/2019 | Nakaki et al. |
| 2019/0393240 A1 | 12/2019 | Kim et al. |

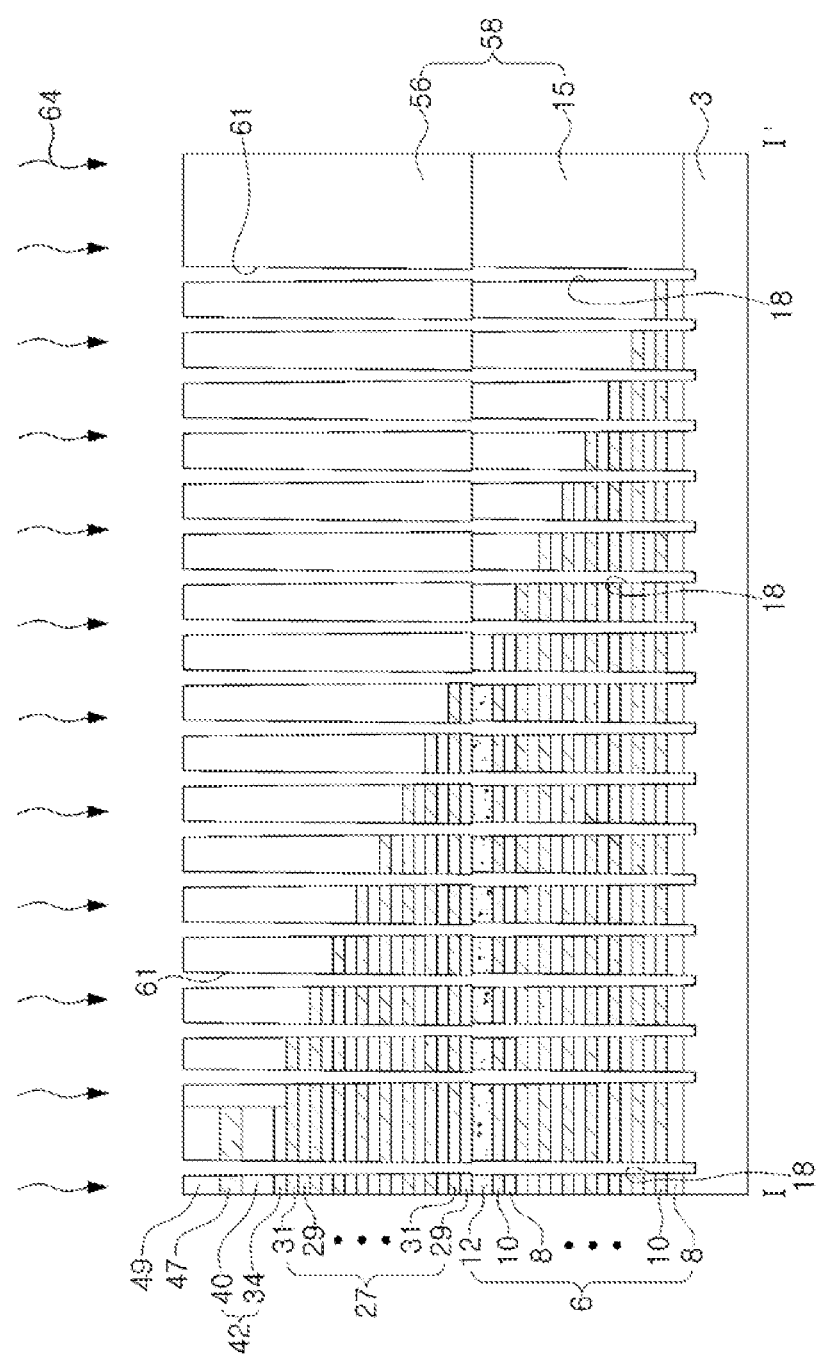

SEMICONDUCTOR DEVICE INCLUDING GATE LAYER AND VERTICAL STRUCTURE

CROSS-REFERENCE TO RELATED APPLICATIONS

This is a continuation application based on pending application Ser. No. 16/835,559, filed Mar. 31, 2020, the entire contents of which is hereby incorporated by reference Korean Patent Application No. 10-2019-0081435, filed on Jul. 5, 2019, in the Korean Intellectual Property Office, and entitled: "Semiconductor Device Including Gate Layer and Vertical Structure and Method of Forming the Same," is incorporated by reference herein in its entirety.

BACKGROUND

1. Field

Embodiments relate to a semiconductor device including a gate layer and a vertical structure and a method of forming the semiconductor device.

2. Description of the Related Art

To enhance the price competitiveness of products, degrees of integration of a semiconductor device may be improved. A semiconductor device, in which memory cells are arranged three-dimensionally rather than two-dimensionally, has been considered, in order to improve integration density of the semiconductor device.

SUMMARY

The embodiments may be realized by providing a semiconductor device including a first vertical structure on a substrate; a second vertical structure on the substrate; and interlayer insulating layers and gate layers alternately and repeatedly stacked on the substrate, wherein the gate layers are sequentially stacked in a memory cell array area of the substrate and extend into an extension area of the substrate adjacent to the memory cell array area of the substrate, the gate layers have pad regions arranged to have a staircase structure in the extension area, the first vertical structure has a side surface facing the gate layers in the memory cell array area, the second vertical structure has a side surface facing at least one of the gate layers in the extension area, the first vertical structure includes a first core pattern, a first semiconductor layer on a side surface of the first core pattern, and a pad pattern on an upper surface of the first core pattern, the second vertical structure includes a second core pattern and a second semiconductor layer on a side surface of the second core pattern, each of the first core pattern and the second core pattern includes an insulating material, and an upper surface of the second semiconductor layer and an upper surface of the second core pattern are farther from the substrate than the upper surface of the first core pattern is from the substrate.

The embodiments may be realized by providing a semiconductor device including a stacked structure on a substrate, the stacked structure including a plurality of gate layers spaced apart from each other in a vertical direction perpendicular to an upper surface of the substrate; a capping structure on the stacked structure; an upper insulating layer on the capping structure; a first vertical structure penetrating through a first region of the stacked structure and extending into the capping structure; a second vertical structure penetrating through a second region of the stacked structure and extending into the capping structure, the second region of the stacked structure being adjacent to the first region of the stacked structure; and a contact plug penetrating through the upper insulating layer, wherein the first vertical structure includes a first core pattern, a first semiconductor layer on a side surface of the first core pattern, and a pad pattern on an upper surface of the first core pattern, the second vertical structure includes a second core pattern and a second semiconductor layer on a side surface of the second core pattern, the pad pattern is electrically connected to the contact plug, and the upper insulating layer is in contact with the second semiconductor layer and the second core pattern.

The embodiments may be realized by providing a semiconductor device including a stacked structure on a substrate, the stacked structure including a stacked region and a staircase region adjacent to the stacked region; a capping structure on the stacked structure; a first vertical structure penetrating through the stacked region of the stacked structure and extending into the capping structure; a second vertical structure penetrating through the staircase region of the stacked structure and extending into the capping structure; an upper insulating layer on the capping structure, the first vertical structure, and the second vertical structure; and a bit line contact plug penetrating through the upper insulating layer and being electrically connected to the first vertical structure, wherein the first vertical structure includes a first core pattern, a first semiconductor layer on a side surface of the first core pattern, and a pad pattern on an upper surface of the first core pattern, the pad pattern is in contact with the bit line contact plug, the second vertical structure includes a second core pattern and a second semiconductor layer on a side surface of the second core pattern, each of the first core pattern and the second core pattern includes an insulating material, and an upper surface of the second semiconductor layer and an upper surface of the second core pattern are farther from the substrate than the upper surface of the first core pattern is from the substrate.

The embodiments may be realized by providing a method of forming a semiconductor device, the method including forming a mold structure on a substrate such that the mold structure includes interlayer insulating layers and preliminary gate layers alternately and repeatedly stacked; forming a first capping pattern and a mask layer sequentially stacked on the mold structure; patterning the mold structure to form a staircase structure in a region adjacent to the first capping pattern; forming a second capping pattern such that the second capping pattern covers the staircase structure; forming a plurality of holes, the plurality of holes including a first hole that penetrates through the mask layer, the first capping pattern, and the mold structure, and a second hole that penetrates through the second capping pattern and the mold structure; performing an annealing process to discharge gases in the interlayer insulating layers, the first capping pattern, and the second capping pattern; and forming vertical structures in the plurality of holes.

BRIEF DESCRIPTION OF DRAWINGS

Features will be apparent to those of skill in the art by describing in detail exemplary embodiments with reference to the attached drawings in which.

DETAILED DESCRIPTION

Figure 1:
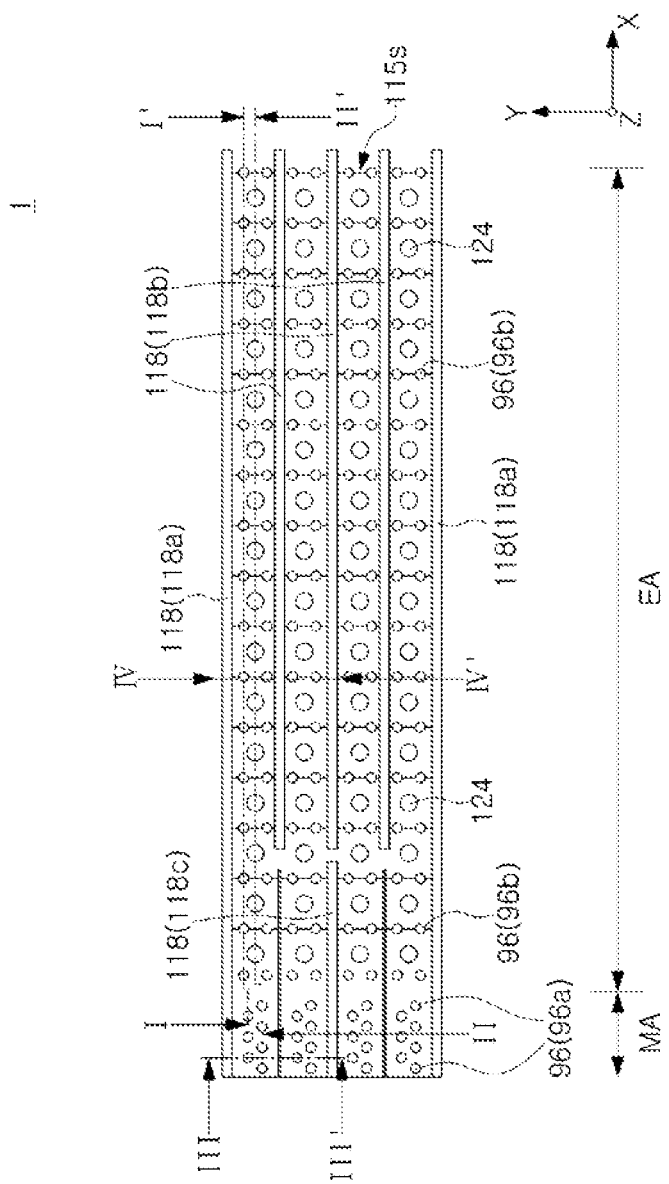
FIG. 1 illustrates a plan view of a semiconductor device according to example embodiments.
Figure 2A:
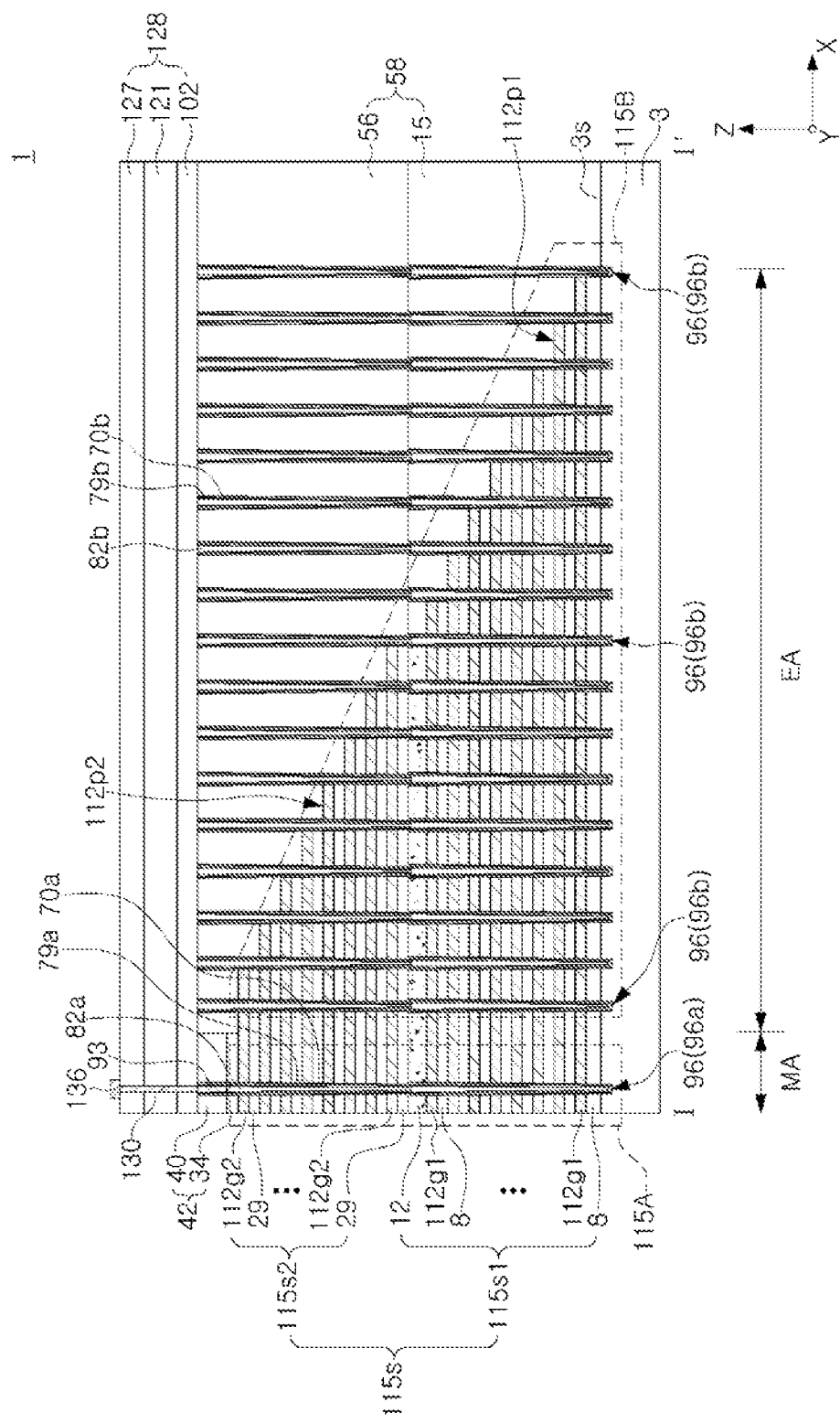
FIGS. 2A to 2C illustrate cross-sectional views of a semiconductor device according to an example embodiment.
Figure 2B:
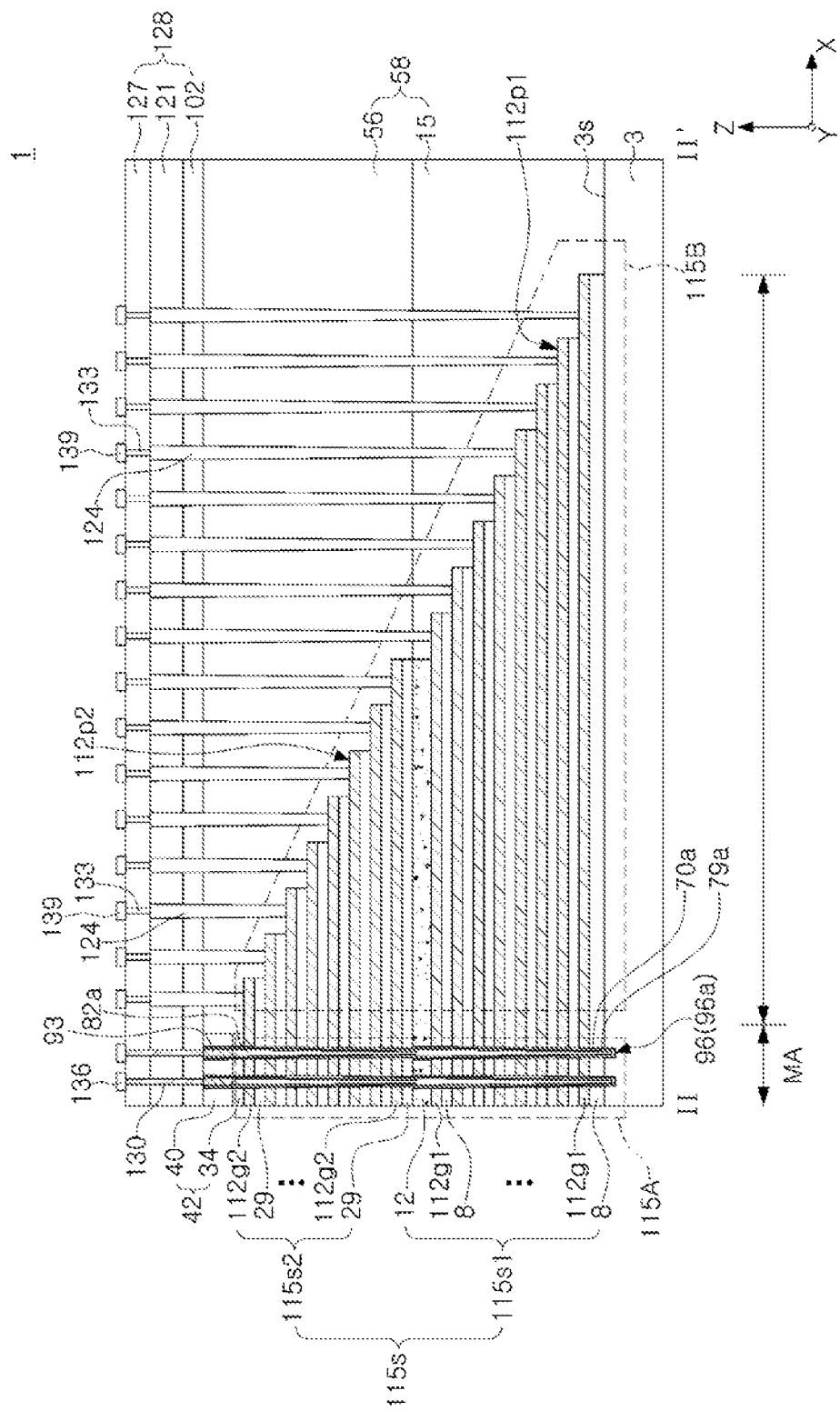
Figure 2C:
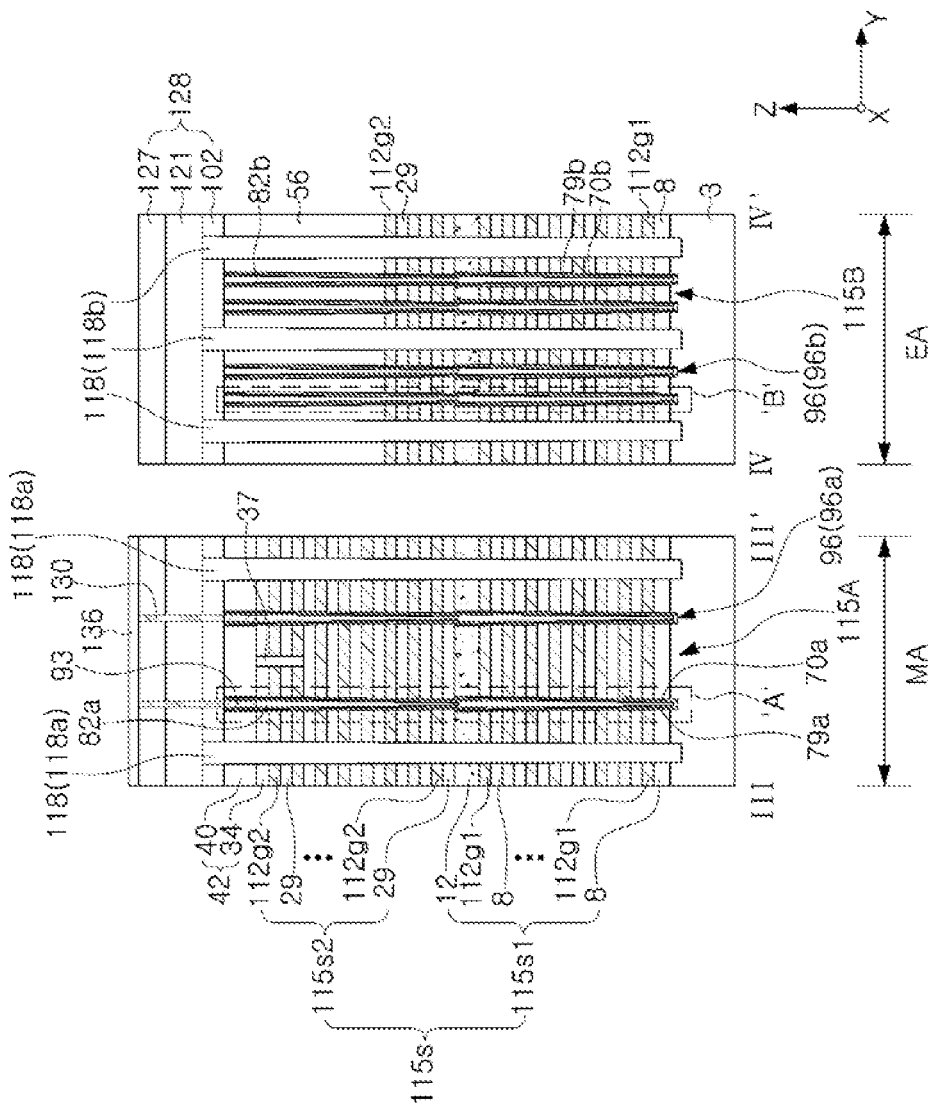

Hereinafter, a semiconductor device according to an example embodiment will be described with reference to FIG. 1 and FIGS. 2A to 2C. FIG. 1 illustrates a plan view of some components to describe a semiconductor device according to example embodiments. FIG. 2A illustrates a cross-sectional view of a region taken along line I-I' of FIG. 1 to describe a semiconductor device according to an example embodiment. FIG. 2B illustrates a cross-sectional view of a region taken along line II-II' of FIG. 1 to illustrate a semiconductor device according to an example embodiment. FIG. 2C illustrates a cross-sectional view of a region taken along line of FIG. 1 to describe a semiconductor device according to an example embodiment.

Referring to FIG. 1 and FIGS. 2A to 2C, a semiconductor device 1 according to an example embodiment may include a substrate 3, a stacked structure 115s, a capping structure 42 and 58, and a plurality of vertical structures 96. The substrate 3 may include a semiconductor substrate 3.

The stacked structure 115s may be on the substrate 3. The stacked structure 115s may include a first stacked group 115s1 on the substrate 3 and a second stacked group 115s2 on the first stacked group 115s1.

The stacked structure 115s may be on a memory cell array area MA of the substrate 3 and may extend into an extension area EA of the substrate 3 adjacent to the memory cell array area MA. The stacked structure 115s may include interlayer insulating layers and gate layers stacked alternately and repeatedly (e.g., in a vertical direction Z). For example, the first stacked group 115s1 may include first interlayer insulating layers 8 and first gate layers 112g1 stacked alternately and repeatedly, and the second stacked group 115s2 may include second interlayer insulating layers 29 and second gate layers 112g2 stacked alternately and repeatedly. The first and second gate layers 112g1 and 112g2 may be substantially parallel to an upper surface 3s of the substrate 3 (e.g., a plane defined by a first direction X and a second direction Y).

The first stacked group 115s1 may further include an intermediate interlayer insulating layer 12 on an uppermost first gate layer 112g1 of the first gate layers 112g1 (e.g., the first gate layer 112g1 that is farthest from the substrate 3 in the vertical direction Z). The intermediate interlayer insulating layer 12 may be between the uppermost first gate layer 112g1 and a lowermost second interlayer insulating layer 29 of the second interlayer insulating layers 29 (e.g., the second interlayer insulating layer 29 that is closest to the substrate 3 in the vertical direction Z).

The stacked structure 115s may include a first region 115A and a second region 115B adjacent to the first region 115A. The first region 115A of the stacked structure 115s may be on the memory cell array area MA of the substrate 3, and the second region 115B of the stacked structure 115s may be on the extension area EA of the substrate 3. The first region 115A of the stacked structure 115s may be referred to as a 'stacked region', and the second region 115B of the stacked structure 115s may be referred to as a 'staircase region'.

The first gate layers 112g1 may be spaced apart from each other and stacked in the vertical direction Z in the first region 115A and may extend into the second region 115B from the first region 115A. The vertical direction Z may be a direction perpendicular to the upper surface of the substrate 3 (e.g., perpendicular to the first direction X and the second direction Y). The first gate layers 112g1 may include first gate pad regions 112p1 in a staircase structure in the second region 115B.

The second gate layers 112g2 may be spaced apart from each other and stacked in the vertical direction Z in the first region 115A and may extend into the second region 115B from the first region 115A. The second gate layers 112g2 may include second gate pad regions 112p2 in a staircase structure in the second region 115B of the stacked structure 115s.

The capping structures 42 and 58 may be on the substrate 3. In an implementation, the capping structures 42 and 58, the first interlayer insulating layers 8, and the second interlayer insulating layers 29 may be formed of a silicon oxide in which a gas is removed or reduced by an annealing process. For example, a semiconductor device 1, capable of improving integration density and reducing defects, may be provided.

The capping structures 42 and 58 may include a first capping pattern 42 (on the first region 115A of the stacked structure 115s) and a second capping pattern 58 (adjacent to the first capping pattern 42 and on the second region 115B of the stacked structure 115s).

The first capping pattern 42 may include a first lower capping layer 34 and a first upper capping layer 40 on the first lower capping layer 34. The first upper capping layer 40 may have a thickness (e.g., in the vertical direction Z) greater than a thickness of the first lower capping layer 34.

The second capping pattern 58 may include a second lower capping layer 15 and a second upper capping layer 56 on the second lower capping layer 15. The second lower capping layer 15 may have an upper surface that is substantially coplanar with an upper surface of the first stacked group 115s1.

The second lower capping layer 15 may cover the first gate pad regions 112p1 of the first stacked group 115s1.

The second upper capping layer 56 may be on the second lower capping layer 15 and may cover the second gate pad regions 112p2 of the second stacked structure 115s. The second upper capping layer 56 and the first capping pattern 42 may have side surfaces facing each other.

In an implementation, the upper surface (e.g., the surface facing away from the substrate 3 in the vertical direction Z) of the second upper capping layer 56 and the upper surface of the first upper capping layer 40 may be substantially coplanar with each other.

The plurality of vertical structures 96 may be in the holes 18 and 61 penetrating through the capping structure 42 and 58 and the stacked structure 115s. For example, the plurality of vertical structures 96 may penetrate through the capping structures 42 and 58 and the stacked structure 115s. The plurality of vertical structures 96 may have upper surfaces that substantially coplanar with each other. The plurality of vertical structures 96 may have substantially the same width (e.g., in the first direction X and/or the second direction Y).

The plurality of vertical structures 96 may include a first vertical structure 96a and a second vertical structure 96b.

The first vertical structure 96a may penetrate through the first region 115A of the stacked structure 115s and extend into the first capping pattern 42. The first vertical structure 96a may penetrate through the first capping pattern 42. The second vertical structure 96b may penetrate through the second region 115B of the stacked structure 115s and may extend into the second capping pattern 58. The second vertical structure 96b may penetrate through the second capping pattern 58. The first vertical structure 96a may have a side surface facing the first and second gate layers 112g1 and 112g2 in the memory cell array area MA. The second vertical structure 96b may have a side surface facing at least one of the first and second gate layers 112g1 and 112g2 in the extension area EA.

The first vertical structure 96a may include a first core pattern 82a and a pad pattern 93 on an upper surface of the first core pattern 82a. The second vertical structure 96b may include a second core pattern 82b.

The first core pattern 82a and the second core pattern 82b may include an insulating material. The first core pattern 82a and the second core pattern 82b may be formed of the same material, e.g., a silicon oxide. The second core pattern 82b may have an upper surface higher (e.g., farther from the substrate 3 in the vertical direction Z) than an upper surface of the first core pattern 82a. The pad pattern 93 may have an upper surface substantially coplanar with an upper surface of the second core pattern 82b.

In an implementation, the first vertical structure 96a may further include a first semiconductor layer 79a on a side surface of the first core pattern 82a, and the second vertical structure 96b may further include a second semiconductor layer 79b on a side surface of the second core pattern 82b.

In an implementation, the first vertical structure 96a may further include a first dielectric structure 70a on an external side surface of the first semiconductor layer 79a, and the second vertical structure 96b may further include a second dielectric structure 70b on an external side surface of the second semiconductor layer 79b.

In an implementation, the plurality of vertical structures 96 may penetrate through the stacked structure 115s and may extend into the substrate 3.

Each of the first and second gate layers 112g1 and 112g2 may have a side surface facing the first vertical structure 96a. Each of the first and second gate layers 112g1 and 112g2 may have a side surface in contact with the first vertical structure 96a.

A part of the first and second gate layers 112g1 and 112g2 may have side surfaces in contact with the second vertical structure 96b, and another part of the first and second gate layers 112g1 and 112g2 may be spaced apart from the second vertical structure 96b.

The semiconductor device 1 according to an example embodiment may further include an upper insulating structure 128 on the capping structures 42 and 58. The upper insulating structure 128 may include a first upper insulating layer 102, a second upper insulating layer 121, and a third upper insulating layer 127, stacked sequentially.

The semiconductor device 1 according to an example embodiment may further include a bit line contact plug 130 penetrating through the upper insulating structure 128 and being electrically connected to the pad pattern 93 of the first vertical structure 96a. The semiconductor device 1 according to an example embodiment may further include a bit line 136 on the bit line contact plug 130.

The semiconductor device 1 according to an example embodiment may further include gate contact plugs 124, sequentially penetrating through the second upper insulating layer 121, the first upper insulating layer 102, and the second capping pattern 58 and being electrically connected to the first gate pad regions 112p1 and the second gate pad regions 112p2.

The semiconductor device 1 according to an example embodiment may further include upper contact plugs 133, penetrating through the third upper insulating layer 127 and being electrically connected to the gate contact plugs 124. The semiconductor device 1 according to an example embodiment may further include gate interconnections 139 on the upper contact plugs 133.

In an implementation, the semiconductor device 1 may further include separation structures 118 penetrating through the first upper insulating layer 102, the capping structures 42 and 58, and the stacked structure 115s. The separation structures 118 may extend (e.g., lengthwise) in the first direction X. The first direction X may be a direction parallel to the upper surface 3s of the substrate 3. The separation structures 118 may have upper surfaces at a higher level (e.g., farther from the substrate 3 in the vertical direction Z) than the upper surfaces of the vertical structures 96.

The separation structures 118 may include first separation structures 118a, second separation structures 118b (between the first separation structures 118a), and a third separation structure 118c (between the first separation structures 118a and having an end facing an end of any one of the second separation structures 118b). Each of the first separation structures 118a may have a length greater than a length of each of the second separation structures 118b in the first direction X. The third separation structure 118c may be in the first region 115A of the stacked structure 115s and may extend into the second region 115B, and the second separation structures 118b may be in the second region 115B of the stacked structure 115s.

In an implementation, the separation structures 118 may be formed of an insulating material. In an implementation, the separation structures 118 may include an insulating material and a conductive material. In an implementation, each of the separation structures 118 may include a conductive material layer and an insulating material layer on a side surface of the conductive material layer.

The semiconductor device 1 according to an example embodiment may further include an insulating pattern 37 penetrating through at least an uppermost second gate layer 112g2 of the second gate layers 112g2. In an implementation, the insulating pattern 37 may also penetrate through a second gate layer 112g2 immediately adjacent to the uppermost second gate layer 112g2, and may extend in the vertical direction Z to also penetrate through the uppermost second gate layer 112g2. The insulating pattern 37 may be in the form of a line extending lengthwise in the first direction X and may be between the first separation structures 118a and the third separation structure 118c. A width of each of the separation structures 118 in the second direction Y may be greater than a width of the insulating pattern 37 in the second direction Y. The second direction Y may be parallel to the upper surface 3s of the substrate 3 and may be perpendicular to the first direction X.

Figure 3:
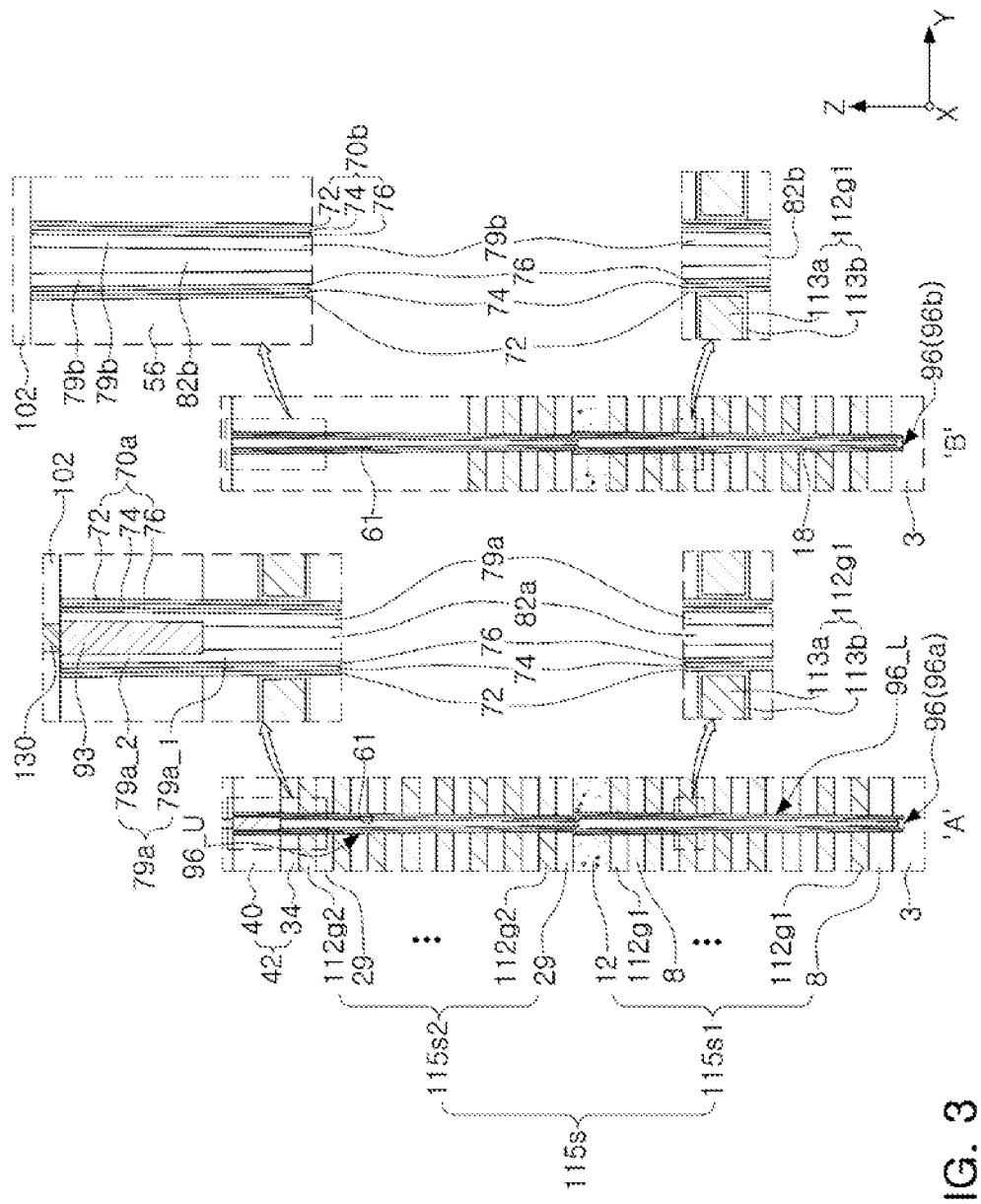
FIG. 3 illustrates a partially enlarged cross-sectional view of a semiconductor device according to a modified embodiment.

Hereinafter, examples of the stacked structure 115s and the vertical structures 96 will be described with reference to FIG. 3. FIG. 3 illustrates a partially enlarged cross-sectional view of portions 'A' and 'B' of FIG. 2C.

In an implementation, referring to FIG. 3, each of the first gate layers 112g1 and the second gate layers 112g2 may include a first layer 113a and a second layer 113b. The second layer 113b may extend between the first layer 113a and the vertical structures 96 while covering the lower and upper surfaces of the first layer 113a.

In an implementation, the first layer 113a may include a first conductive material (e.g., tungsten (W), or the like), and the second layer 113b may include a second conductive material different from the first conductive material (e.g., titanium nitride (TiN), tungsten nitride (WN), or the like).

In an implementation, the first layer 113a may include a conductive material (e.g., TiN, W, or the like), and the second layer 113b may include a dielectric material. The dielectric material of the second layer 113b may be a high-k dielectric such as an aluminum oxide (AlO).

As described above, the vertical structures 96 may include the first vertical structure 96a and the second vertical structure 96b, the first vertical structure 96a may include the first dielectric structure 70a, the first semiconductor layer 79a, the first core pattern 82a, and the pad pattern 93, and the second vertical structure 96b may include the second dielectric structure 70b, the second semiconductor layer 79b, and the second core pattern 82b.

In an implementation, the first semiconductor layer 79a may cover the side surface of the first core pattern 82a and may extend in the vertical direction Z to cover a side surface of the pad pattern 93.

In an implementation, the first semiconductor layer 79a may have an upper surface substantially coplanar with an upper surface of the pad pattern 93.

In an implementation, the second semiconductor layer 79b may have an upper surface substantially coplanar with an upper surface of the pad pattern 93.

In an implementation, the second core pattern 82b may have an upper surface substantially coplanar with an upper surface of the pad pattern 93.

In an implementation, an upper surface of the first dielectric structure 70a, an upper surface of the first semiconductor layer 79a, and an upper surface of the pad pattern 93 may be substantially coplanar with each other.

In an implementation, an upper surface of the second dielectric structure 70b, an upper surface of the second semiconductor layer 79b, and an upper surface of the second core pattern 82b may be substantially coplanar with each other.

An upper surface of the second semiconductor layer 79b and an upper surface of the second core pattern 82b may be higher than the upper surface of the first core pattern 82a of the first vertical structure 96a. The "height" may be a height based on a distance in the vertical direction Z from the upper surface of the substrate 3.

In an implementation, the pad pattern 93 may have a width (e.g., in the second direction Y) greater than a width of the first core pattern 82a. The first semiconductor layer 79a may include a first portion 79a_1 and a second portion 79a_2 having a thickness (e.g., in the second direction Y) smaller than a thickness of the first portion 79a_1. The first portion 79a_1 of the first semiconductor layer 79a may cover the side surface of the first core pattern 82a, and the second portion 79a_2 of the first semiconductor layer 79a may cover the side surface of the pad pattern 93. The second portion 79a_2 of the first semiconductor layer 79a may be between the pad pattern 93 and the first dielectric structure 70a (e.g., in the second direction Y). The pad pattern 93 may have a width (e.g., in the second direction Y) greater than a width of the second core pattern 82b. The first portion 79a_1 of the first semiconductor layer 79a may have a thickness (e.g., in the second direction Y) smaller than a thickness of the second semiconductor layer 79b at the same height level as the first portion 79a_1 of the first semiconductor layer 79a.

In an implementation, the first dielectric structure 70a and the second dielectric structure 70b may include the same material layers. For example, each of the first dielectric structure 70a and the second dielectric structure 70b may include a first dielectric layer 72, a second dielectric layer 76, and a data storage layer 74 between the first dielectric layer 72 and the second dielectric layers 76. The first dielectric layer 72 may be a first gate dielectric layer; the second dielectric layer may be a second gate dielectric layer.

The second dielectric layer 76 of the first dielectric structure 70a may be between the data storage layer 74 and the first semiconductor layer 79a, and the second dielectric layer 76 of the second dielectric structure 70b may be between the data storage layer 74 and the second semiconductor layer 79b.

In an implementation, the first gate layers 112g1 may include a single or a plurality of first lower gate layers and a plurality of first upper gate layers on the single or plurality of first lower gate layers. The second gate layers 112g2 may include a plurality of second lower gate layers and a single or a plurality of second upper gate layers on the second lower gate layers.

Among the first gate layers 112g1 and the second gate layers 112g2, the plurality of first upper gate layers and the plurality of second lower gate layers may include wordlines. At least one of the single or the plurality of first lower gate layers may be a lower select gate line, and at least one of the single or the plurality of second upper gate layers may be an upper select gate line.

In an implementation, the data storage layer 74 of the first vertical structure 96a may include regions capable of storing data in a semiconductor device, e.g., a vertical NAND flash memory device. For example, regions of the data storage layer 74 of the first vertical structure 96a, between gate layers, which may be wordlines, among the first and second gate layers 112g1 and 112g2, and the first semiconductor layer 79a, may be regions capable of storing data.

In an implementation, the first semiconductor layer 79a of the first vertical structure 96a may be a channel layer or a channel region of a vertical NAND flash memory device.

In an implementation, each of the vertical structures 96 may include a lower vertical structure 96_L and an upper vertical structure 96_U on the lower vertical structure 96_L. For example, each of the first and second vertical structures 96a and 96b may include the lower vertical structure 96_L and the upper vertical structure 96_U. The lower vertical structure 96_L of the each of the first and second vertical structures 96a and 96b may penetrate through the first stack group 115s1. The upper vertical structure 96_U of the each of the first and second vertical structures 96a and 96b may penetrate through the second stack group 115s2. An upper region of the lower vertical structure 96_L, e.g., at a region thereof adjacent to the upper vertical structure 96_U, may have a width (e.g., in the second direction Y) greater than a width of a lower region of the upper vertical structure 96_U adjacent to the lower vertical structure 96_L.

The first upper insulating layer 102 may cover the entire upper surface of the second vertical structure 96b. The first upper insulating layer 102 may be in contact with an upper surface of the second dielectric structure 70b of the second vertical structure 96b, an upper surface of the second semiconductor layer 79b, and an upper surface of the second core pattern 82b.

In an implementation, the first vertical structure 96a may have a width narrower or greater than a width of the bit line contact plug 130. The bit line contact plug 130 may be electrically connected to the pad pattern 93 of the first vertical structure 96a. The pad pattern 93 may be formed of doped silicon. A portion of the upper surface of the first vertical structure 96a may be in contact with the first upper insulating layer 102.

Next, various modified examples of the semiconductor device according to an example will be described with reference to FIGS. 4A, 4B, 5A, and 5B. Each of FIGS. 4A, 4B, 5A, and 5B illustrates a partially enlarged cross-sectional view of portions 'A' and 'B' of FIG. 2C. Hereinafter, descriptions will focus on modified components among the above-described components, and the other components will be directly referred to or descriptions thereof will be omitted.

Hereinafter, modified examples of the pad pattern (93 of FIG. 3) and the first semiconductor layer (79a of FIG. 3) will be described with reference to FIG. 4A.

Figure 4A:
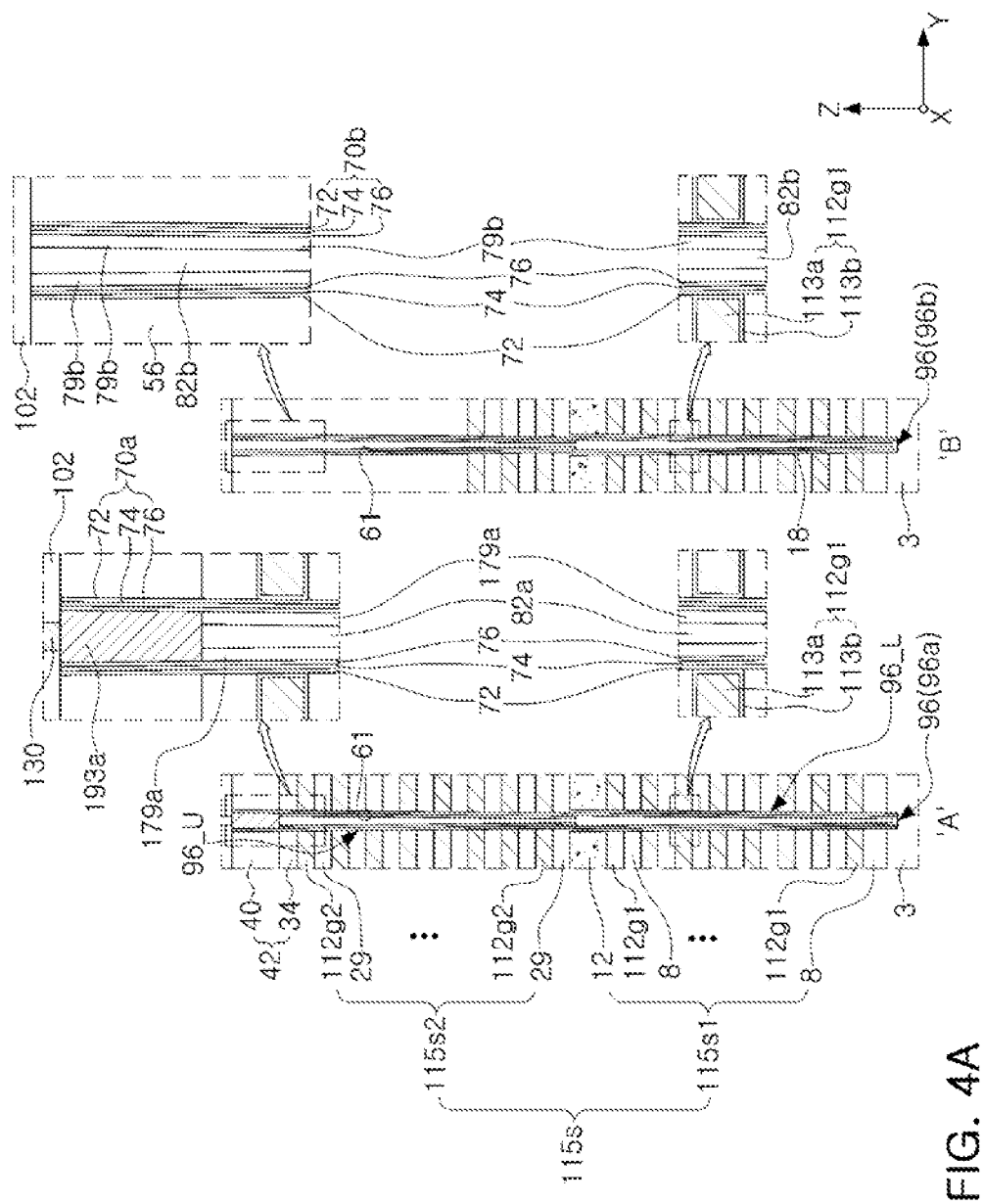
FIG. 4A illustrates a partially enlarged cross-sectional view of a semiconductor device according to a modified embodiment.

In an implementation, referring to FIG. 4A, the pad pattern 193a may have a width greater than a width of the first core pattern 82a. The first semiconductor layer 179a may have an upper surface in contact with a lower surface of the pad pattern 193a. The lower surface of the pad pattern 193a may be in contact with an upper surface of the first semiconductor layer 179a and an upper surface of the first core pattern 82a. An upper surface of the second semiconductor layer 79b may be coplanar with an upper surface of the pad pattern 193a and may be higher than an upper surface of the first semiconductor layer 179a.

Hereinafter, modified examples of the pad pattern (93 of FIG. 3) and the first semiconductor layer (79a of FIG. 3) will be described with reference to FIG. 4B.

Figure 4B:
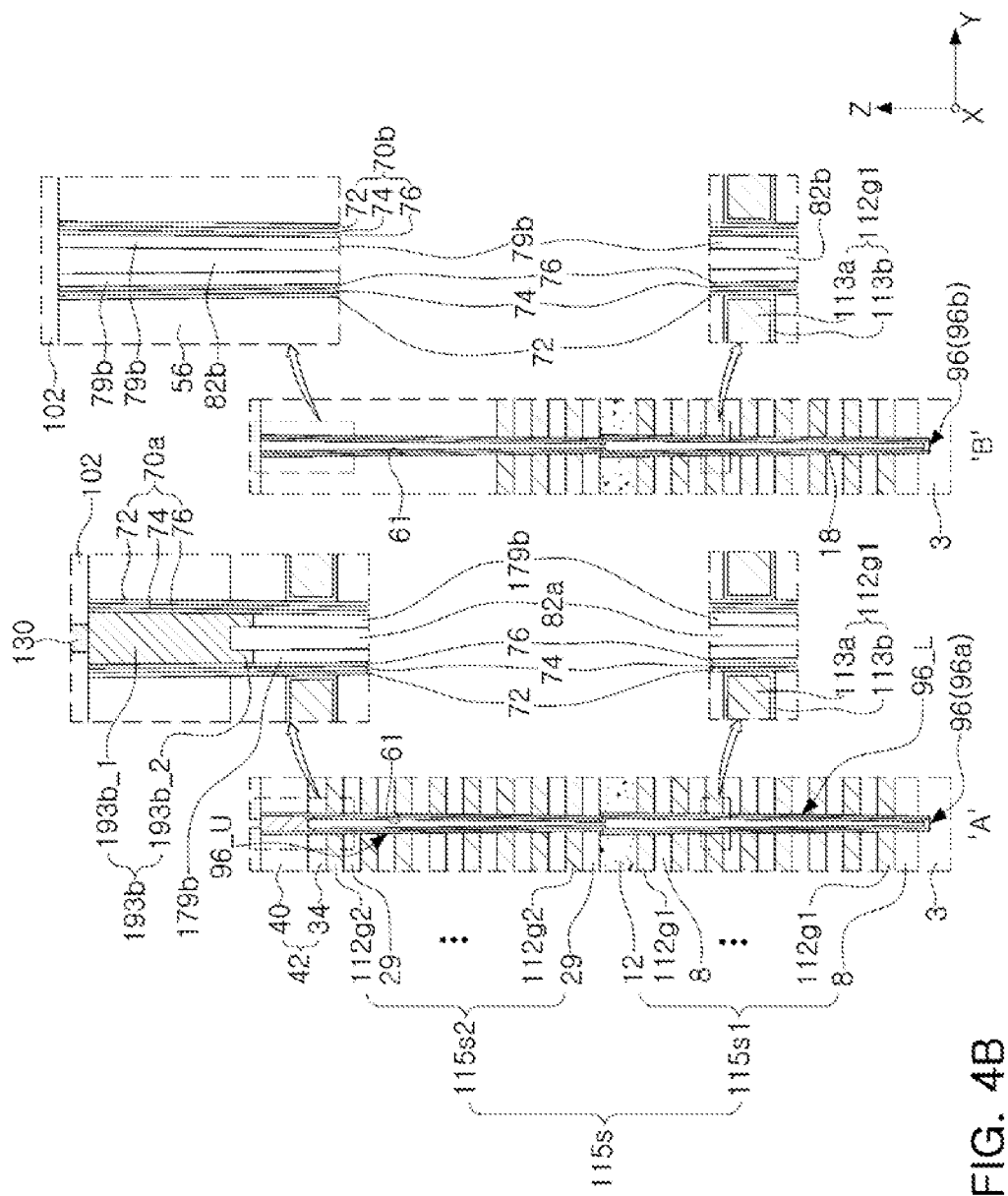
FIG. 4B illustrates a partially enlarged cross-sectional view of a semiconductor device according to a modified embodiment.

In an implementation, referring to FIG. 4B, a pad pattern 193b may include a first portion 193b_1, on the first core pattern 82a, and a second portion 193b_2 extending in a direction toward the substrate 3 (e.g., in the vertical direction Z) from the first portion 193b_1 to be in contact with an upper side surface of the first core pattern 82a.

The first semiconductor layer 179b may be in contact with the second portion 193b_2 of the pad pattern 193b. An upper surface of the first semiconductor layer 179b may be lower than an upper surface of the first core pattern 82a. For example, a distance between the upper surface of the first semiconductor layer 179b and the upper surface of the substrate 3 in the vertical direction Z may be shorter than a distance between the upper surface of the first core pattern 82a and the upper surface of the substrate 3 in the vertical direction Z.

Hereinafter, modified examples of the first dielectric structure (70a of FIG. 3), the second dielectric structure (70b of FIG. 3), the first gate layers (112g1 of FIG. 3), and the second gate layers (112g2 of FIG. 3) will be described with reference to FIG. 5A.

Figure 5A:
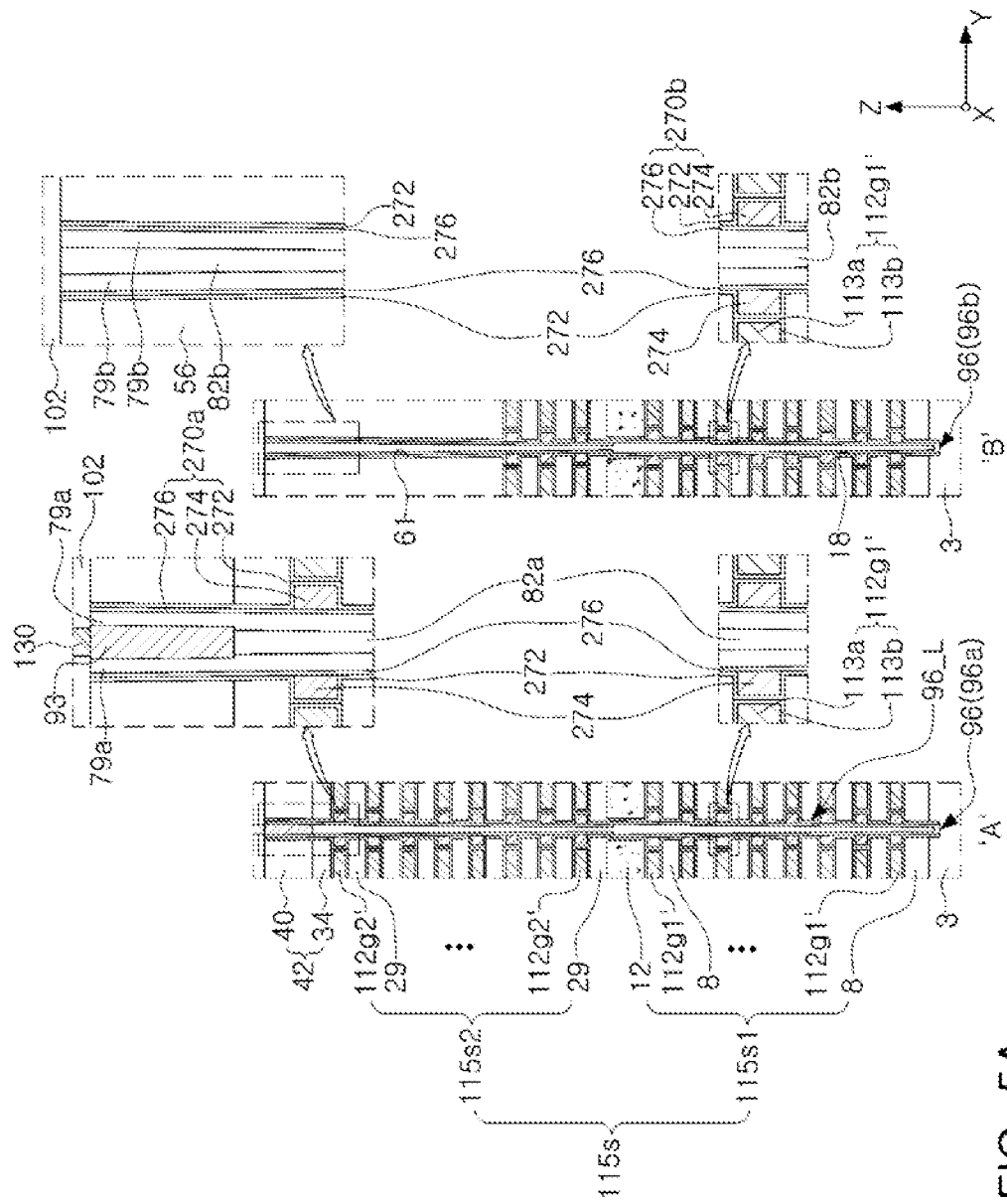
FIG. 5A illustrates a partially enlarged cross-sectional view of a semiconductor device according to a modified embodiment.

In an implementation, referring to FIG. 5A, the first gate layers 112g1' may have side surfaces recessed further than sides surfaces of the first interlayer insulating layers 8. The second gate layers 112g2' may have side surfaces recessed further than side surfaces of the second interlayer insulating layers 29.

Each of the first dielectric structure 270a and the second dielectric structure 270b may include a first dielectric layer 272, a second dielectric layer 276, and data storage patterns 274 between the first dielectric layer 272 and the second dielectric layer 276. The first dielectric structure 270a may be on an external side surface of the first semiconductor layer 79a, and the second dielectric structure 270b may be on an external side surface of the second semiconductor layer 79b. The data storage patterns 274 may be spaced apart from each other in the vertical direction Z between one first dielectric layer 272 and one second dielectric layer 276.

The data storage patterns 274 may face the first gate layers 212g1 and the second gate layers 212g2. In an implementation, the data storage patterns 274, facing the first gate layers 112g1', may be between the first interlayer insulating layers 8, and the data storage patterns 274, facing the second gate layers 112g2', may be disposed between the second interlayer insulating layers 29.

The data storage patterns 274 of the first vertical structure 96a, facing the first and second gate layers 112g1' and 112g2', which may be wordlines, among the first and second gate layers 112g1' and 112g2', may be regions capable of storing data of a memory device.

Hereinafter, a modified example of the semiconductor device 1 according to an example embodiment will be described with reference to FIG. 5B.

Figure 5B:
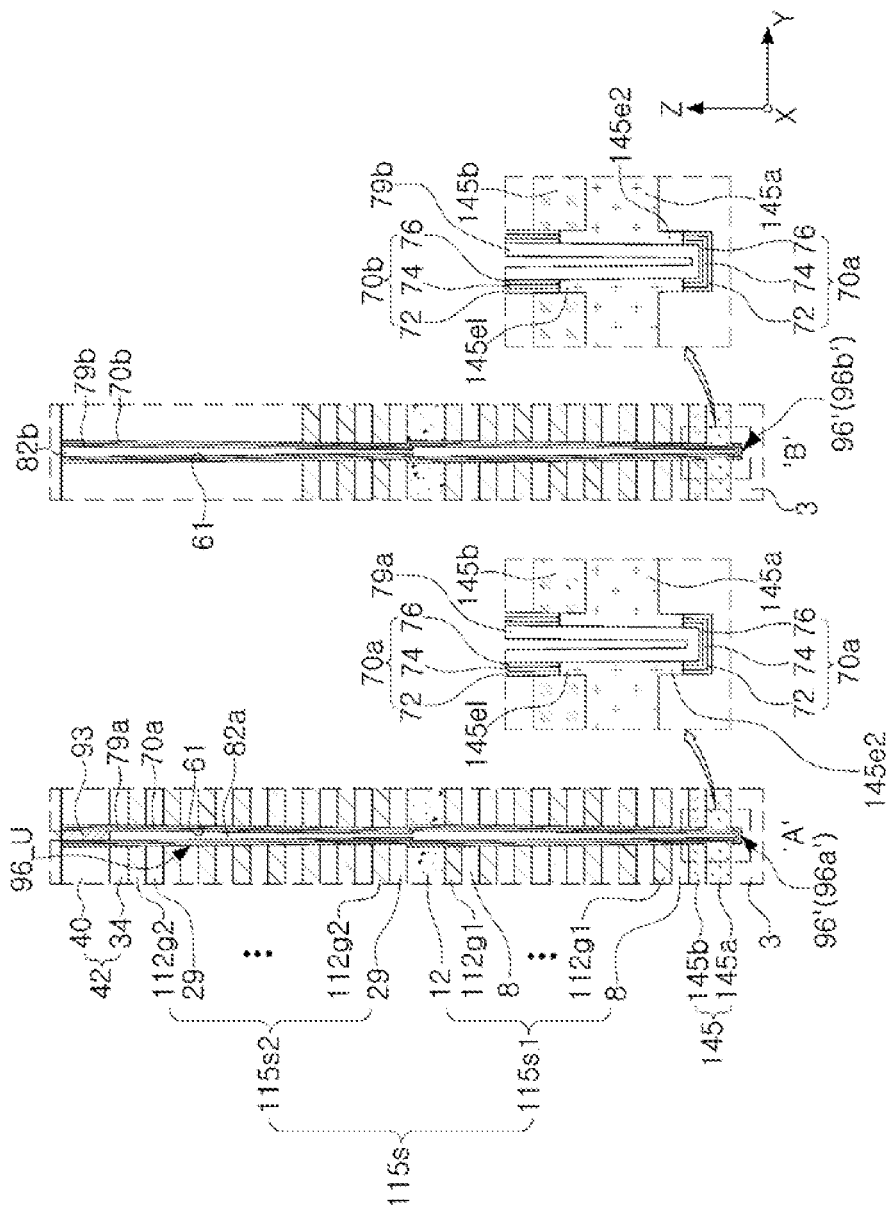
FIG. 5B illustrates a partially enlarged cross-sectional view of a semiconductor device according to a modified embodiment.

In an implementation, referring to FIG. 5B, the semiconductor device 1a may further include a horizontal connection pattern 145 between the stacked structure 115s and the substrate 3. For example, the horizontal connection pattern 145 may be between the lowermost first interlayer insulating layer 8 and the substrate 3.

Vertical structures 96' may penetrate through the capping structures 42 and 58, the stacked structure 115s, and the horizontal connection pattern 145 and may extend into the substrate 3.

The vertical structures 96' may include a first vertical structure 96a' in a position corresponding to the above-described first vertical structure (96a of FIG. 3) and a second vertical structure 96b' in a position corresponding to the above-described second vertical structure (96b of FIG. 3).

The first vertical structure 96a' may include the first core pattern 82a, the pad pattern 93, and the first semiconductor layer 79a described above, and the second vertical structure 96b' may include the second core pattern 82b and the second semiconductor layer 79b described above.

The first vertical structure 96a' may include a first dielectric structure 370a covering an external side surface of the first semiconductor layer 79a and covering a lower surface of the first semiconductor layer 79a. The second vertical structure 96b' may include a second dielectric structure 370b covering an external side surface of the second semiconductor layer 79b and covering a lower surface of the second semiconductor layer 79b.

The horizontal connection pattern 145 may include a first horizontal connection pattern 145a and a second horizontal connection pattern 145b on the first horizontal connection pattern 145a. The first horizontal connection pattern 145a may be formed of silicon. The second horizontal connection pattern 145b may be formed of silicon. The first horizontal connection pattern 145a and the second horizontal connection pattern 145b may be formed of doped polysilicon. In an implementation, the first horizontal connection pattern 145a and the second horizontal connection pattern 145b may be formed of polysilicon having N-type conductivity. In an implementation, at least one of the first horizontal connection pattern 145a and the second horizontal connection pattern 145b may include a metal (e.g., tungsten (W), or the like) or a metal nitride (e.g., a tungsten nitride (WN), a titanium nitride (TiN), or the like). The horizontal connection pattern 145 may be in contact with the substrate 3.

In a region adjacent to the first vertical structure 96a', the first horizontal connection pattern 145a may be in contact with the first semiconductor layer 79a, and the second horizontal connection pattern 145b may be spaced apart from the first semiconductor layer 79a.

In a region adjacent to the second vertical structure 96b', the first horizontal connection pattern 145a may be in contact with the second semiconductor layer 79b, and the second horizontal connection pattern 145b may be spaced apart from the second semiconductor layer 79b.

The first horizontal connection pattern 145a may include a portion 145e1, extending from a portion in contact with the first semiconductor layer 79a to a portion between the second horizontal connection pattern 145b and the first semiconductor layer 79a, and a portion 145e2 extending from the portion in contact with the first semiconductor layer 79a to a portion between the substrate 3 and the first semiconductor layer 79a. Similarly, the first horizontal connection pattern 145a may include a portion 145e1, extending from a portion in contact with the second semiconductor layer 79b to a portion between the second horizontal connection pattern 145b and the second semiconductor layer 79b, and a portion 145e2 extending from the portion in contact with the second semiconductor layer 79b to a portion between the substrate 3 and the second semiconductor layer 79b.

Each of the extending portions 145e1 and 145e2 of the first horizontal connection pattern 145a may have a length (e.g., in the vertical direction Z) smaller than the thickness of the second horizontal connection pattern 145b (e.g., in the vertical direction Z).

Figure 6:
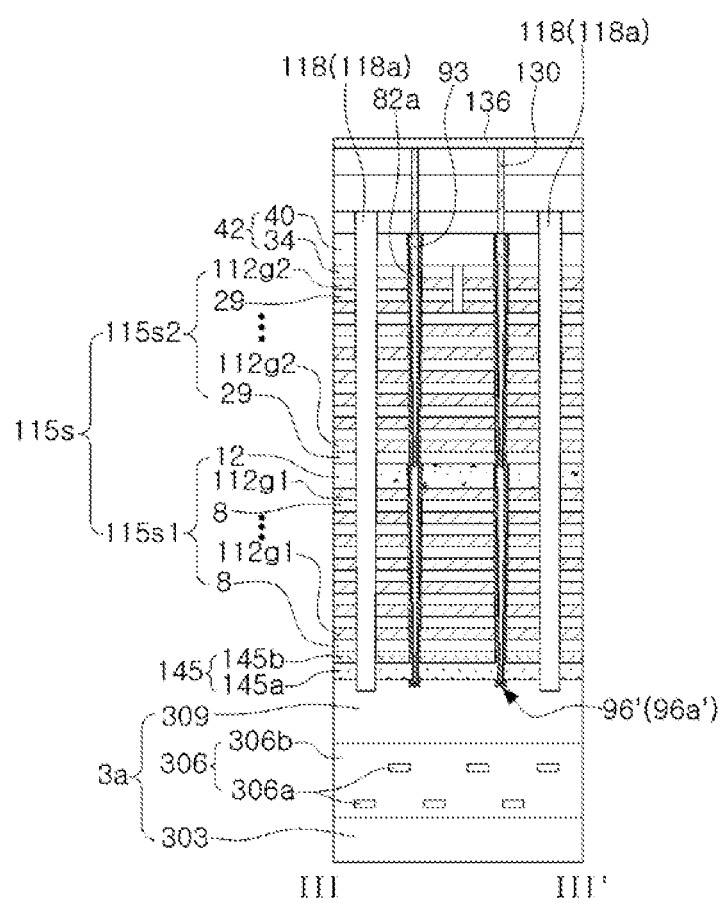
FIG. 6 illustrates a cross-sectional view of a semiconductor device according to a modified embodiment.

Hereinafter, a modified example of the semiconductor device 1 according to an example embodiment will be described with reference to FIG. 6. FIG. 6 illustrates a cross-sectional view of a region taken along line of FIG. 1.

In an implementation, referring to FIG. 6, a substrate 3a may include a lower substrate 303, an upper substrate 309 on the lower substrate 303, and a peripheral circuit region 306 between the lower substrate 303 and the upper substrate 309. The lower substrate 303 may be a semiconductor substrate. The upper substrate 309 may include a semiconductor material and/or a conductive material.

The peripheral circuit region 306 may include a peripheral circuit patterns 306a and a peripheral insulating layer 306b covering the peripheral circuit patterns 306a. The lower substrate 303 may be a semiconductor substrate. The upper substrate 309 may include a semiconductor material and/or a conductive material.

In the modified example, a semiconductor device may include a horizontal connection pattern 145 and vertical structures 96', which are substantially the same as described with reference to FIG. 5B.

The separation structures 118 may be in contact with the horizontal connection pattern 145. In an implementation, the separation structures 118 may penetrate through the horizontal connection pattern 145 and may extend into the upper substrate 309 of the substrate 3a.

Hereinafter, an example of a method of forming a semiconductor device according to an example embodiment will be described with reference to FIG. 1 and FIGS. 7A to 12B.

Figure 7A:
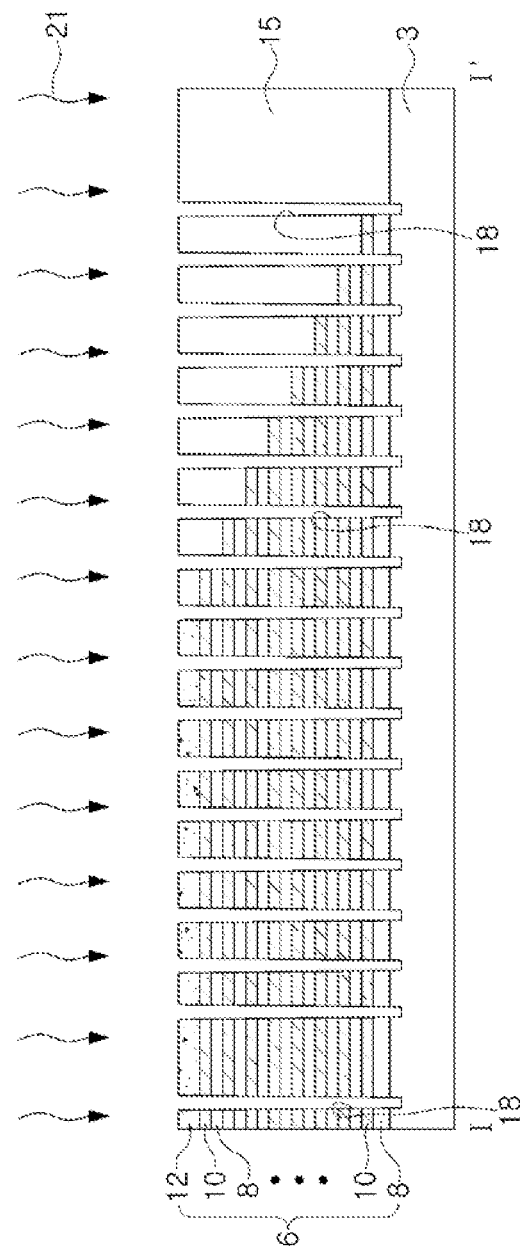
FIGS. 7A to 13B illustrate cross-sectional views of stages in a method of forming a semiconductor device according to an example embodiment.
Figure 7B:
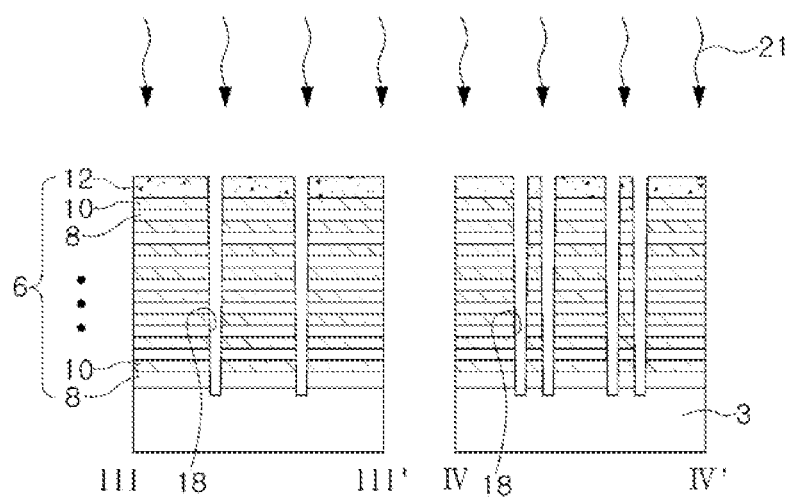
Figure 8B:
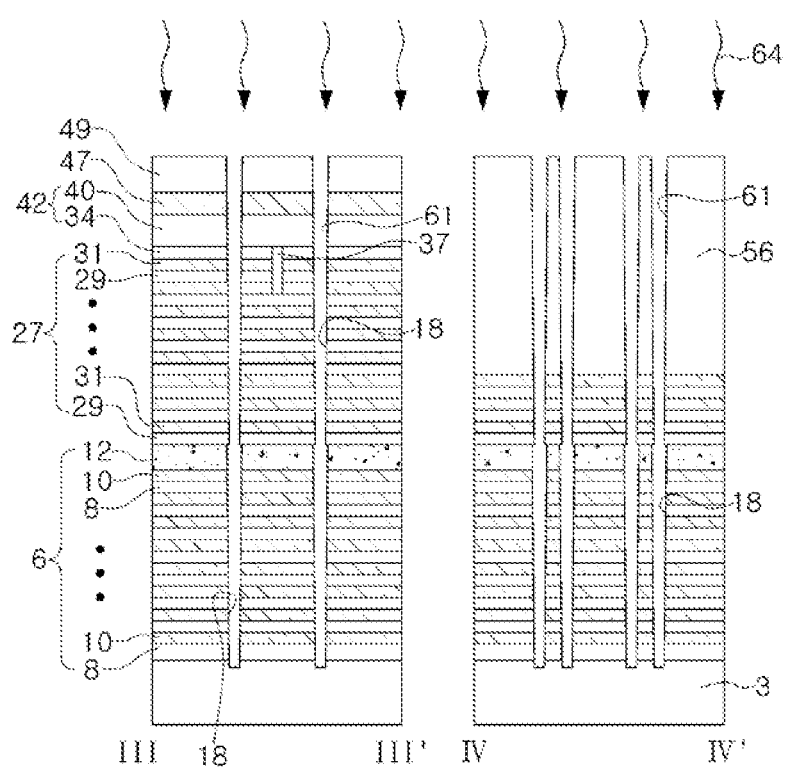

In FIGS. 7A to 12B, FIGS. 7A, 8A, 9A, 10A, 11A, 12A, and 13A are cross-sectional views illustrating a region taken along line I-I' of FIG. 1, and FIGS. 7B and 8B. 9B, 10B, 11B, 12B, and 13B are cross-sectional views illustrating regions taken along lines III-III' and IV-IV' of FIG. 1. FIGS. 7A to 12B illustrate an example of a method of forming the structure of the semiconductor device 1 described with reference to FIG. 1, FIGS. 2A to 2C, and FIG. 3.

Referring to FIGS. 1, 7A, and 7B, a first mold structure 6 may be formed on a substrate 3. The substrate 3 may include a semiconductor substrate.

Forming the first mold structure 6 may include forming first interlayer insulating layers 8 and first preliminary gate layers 10 alternately and repeatedly stacked on the substrate 3, forming an intermediate interlayer insulating layer 12 on an uppermost first preliminary gate layer 10, and patterning the first interlayer insulating layers 8, the first preliminary gate layers 10, and the interlayer insulating layer 12 to form a staircase structure. The first interlayer insulating layers 8 may be formed of an insulating material such as a silicon oxide.

In an implementation, the first preliminary gate layers 10 may be formed of a material different from a material of the first interlayer insulating layers 8, e.g., a silicon nitride.

In an implementation, the first preliminary gate layers 10 may be formed of polysilicon.

An insulating material layer may be formed on the substrate 3 to cover the first mold structure 6. The insulating material layer may be planarized to form a second lower capping layer 15. An upper surface of the second lower capping layer 15 and an upper surface of the first mold structure 6 may be substantially coplanar with each other.

Lower holes 18 may be formed on the substrate 3. A part of the lower holes 18 may penetrate through the first mold structure 6, and the rest of the lower holes 18 may penetrate through the lower capping layer 15 and the first mold structure 6.

In an implementation, the lower holes 18 may expose the substrate 3. In an implementation, the lower holes 18 may extend into the substrate 3.

A first annealing process 21 may be performed to discharge gases in the first interlayer insulating layers 8 and the second lower capping layer 15, e.g., a hydrogen gas, outwardly from the first interlayer insulating layers 8 and the second lower capping layer 15 and to remove the discharged gases. The gas in the first interlayer insulating layers 8 may be discharged outwardly through sidewalls of the lower holes 18, and the gas in the second lower capping layer 15 may be discharged outwardly through the sidewalls of the lower holes 18 and an upper surface of the second lower capping layer 15.

The first interlayer insulating layers 8 and the second lower capping layer 15 may be formed of a silicon oxide, and the first annealing process 21 may be performed at a temperature of approximately 600 degrees Celsius or higher.

Referring to FIGS. 1, 8A, and 8B, lower gap-fill patterns may be formed to fill the lower holes 18. The lower gap-fill patterns may be formed of silicon.

A second mold structure 27 may be formed on the first mold structure 6 and the second lower capping layer 15. The second mold structure 27 may include second interlayer insulating layers 29 and second preliminary gate layers 31 stacked alternately and repeatedly.

The second interlayer insulating layers 29 may be formed of the same material as the first interlayer insulating layers 8, and the second preliminary gate layers 31 may be formed of the same material as the first preliminary gate layers 10.

A first lower capping layer 34 may be formed on the second mold structure 27.

The first lower capping layer 34 may be formed of a silicon oxide.

An insulating pattern 37 may be formed to penetrate through the first lower capping layer 34 and to extend downwardly to penetrate through an uppermost preliminary gate layer and a next upper preliminary gate layer among the second preliminary gate layers 31. The insulating pattern 37 may be formed of a silicon oxide.

A plurality of layers may be formed on the first lower capping layer 34, and the plurality of layers and the first lower capping layer 34 may be patterned to form a first upper capping layer 40 on the first lower capping layer 34 and a mask pattern on the first upper capping layer. The mask pattern may include a first mask layer 47 and a second mask layer 49 stacked sequentially.

In an implementation, the first mask layer 47 may include a silicon nitride, and the second mask layer 49 may include a silicon oxide.

In an implementation, the first lower capping layer 34 and the first upper capping layer 40 may constitute a first capping pattern 42.

The second mold structure 27 may be patterned to form a staircase structure. The staircase structure of the second mold structure 27 may be formed on the first mold structure 6.

An insulating material layer may be formed on the substrate having the second mold structure 27, the first mask layer 47 and the second mask layer 49. The insulating material layer may be planarized down to a top surface of the second mask layer 49 to form a second upper capping layer 56. The second upper capping layer 56 may cover the staircase structure of the second mold structure 27 and the second lower capping layer 15.

In an implementation, the second lower capping layer 15 and the second upper capping layer 56 may constitute a second capping pattern 58.

In an implementation, the first capping pattern 42 and the second capping pattern 58 may constitute capping structures 42 and 58.

Upper holes 61 may be formed to penetrate through the second mask layer 49, the first mask layer 47, and the capping structures 42 and 58 and to expose the lower gap-fill patterns. The lower gap-fill patterns, exposed by the upper holes 61, may be removed.

The lower holes 18 and the upper holes 61 may constitute holes 18 and 61.

A second annealing process 64 may be performed such that the gases in the first interlayer insulating layers 8, the second interlayer insulating layers 29, and the first capping pattern 42 are discharged outwardly through side surfaces of the holes 18 and 61 and the gases in the second capping pattern 58 may be discharged outwardly through the side surfaces of the holes 18 and 61 and an upper surface of the second capping pattern 58.

The first interlayer insulating layers 8, the second interlayer insulating layers 29, the first capping pattern 42, and the second capping pattern 58 may be formed of a silicon oxide. The second annealing process 64 may be performed at a temperature, at which a gas in the silicon oxide, e.g., a hydrogen gas, may be discharged, e.g., 600 degrees Celsius or higher.

Figure 9A:
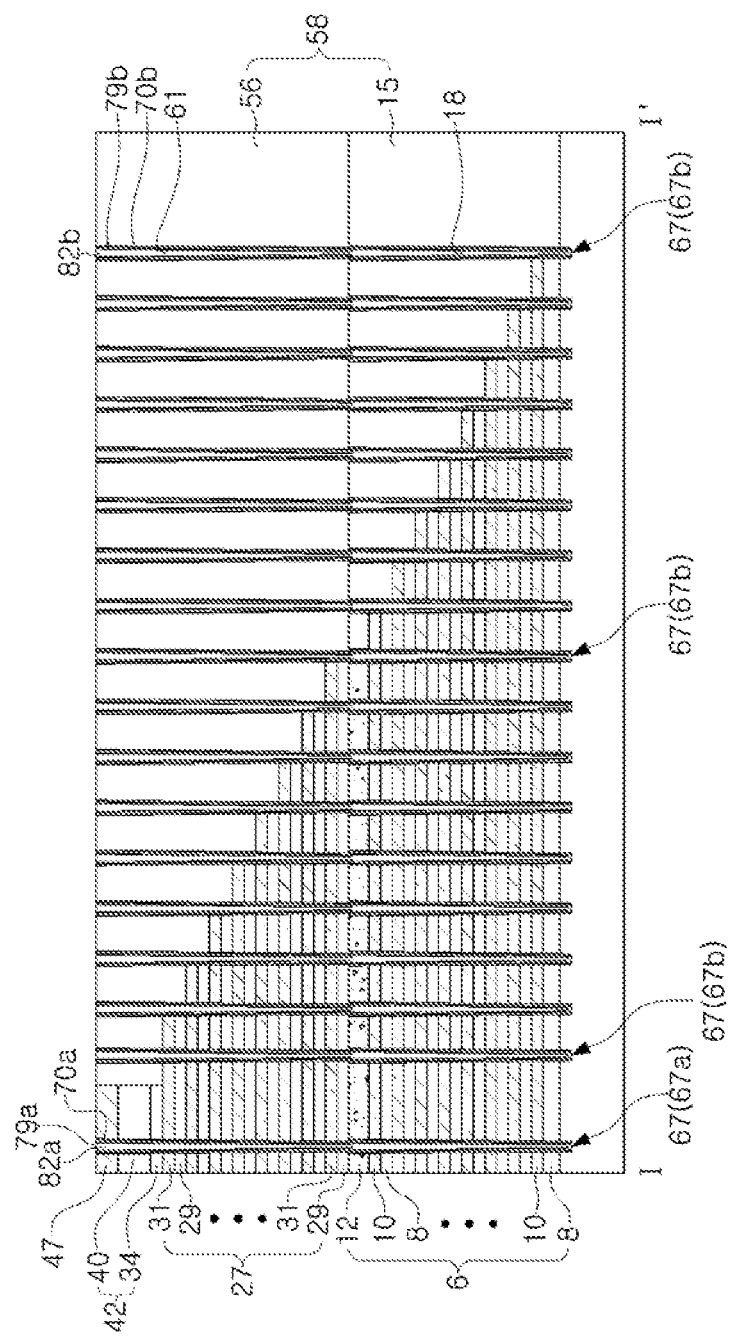
Figure 9B:
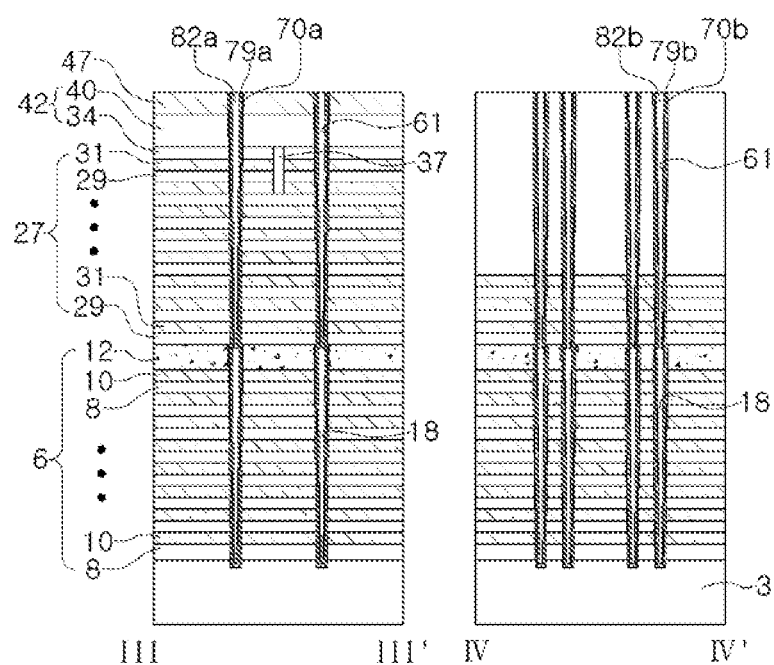

Referring to FIGS. 1, 9A and 9B, preliminary vertical structures 67 may be formed in the holes 18 and 61.

When the preliminary vertical structures 67 are formed, a plurality of layers may be formed to fill the holes 18 and 61 and to cover the second mask layer 49 and the plurality of layers may be planarized to form preliminary vertical structures 67, defined in the holes 18 and 61, while exposing the first mask layer 47.

Forming the preliminary vertical structures 67 may include forming dielectric structures 70a and 70b on the sidewalls of the holes 18 and 61, forming semiconductor layers 79a and 79b to cover the dielectric structures 70a and 70b in the holes 18 and 61 and to cover lower surfaces of the holes 18 and 61, and forming core patterns 81a and 82b to fill the other portions of the holes 18 and 61.

In an implementation, the preliminary vertical structures 67 may include a first preliminary vertical structure 67a and a second preliminary vertical structure 67b. The first preliminary vertical structure 67a may penetrate through the first capping pattern 42, the second mold structure 27, and the first mold structure 6. A plurality of second preliminary vertical structures 67b may be provided. A part of the second preliminary vertical structures 67b may penetrate through the second upper capping layer 56, the second mold structures 27, and the first mold structure 6, and another part of the second preliminary vertical structure 67b may penetrate through the second upper capping layer 56, the first lower capping layer 34, and the first mold structure 6.

Figure 10A:
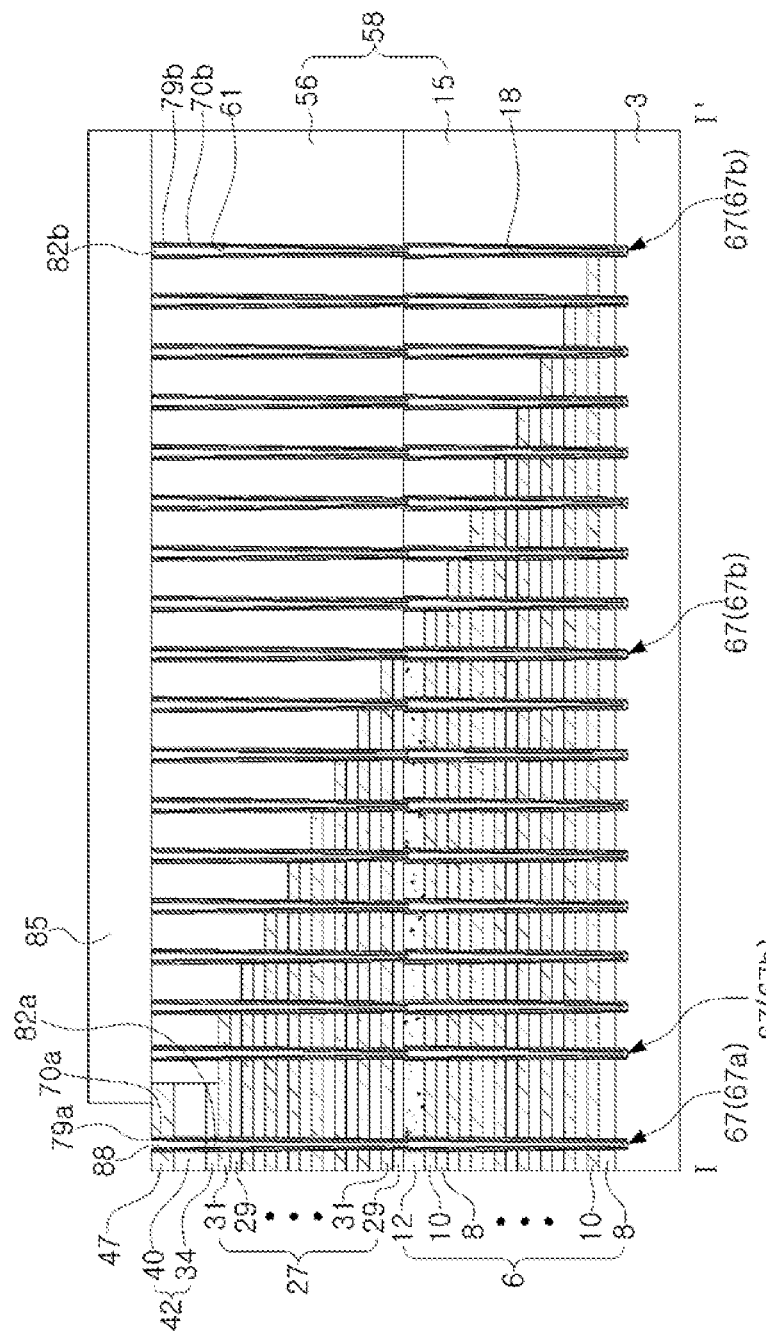
Figure 10B:
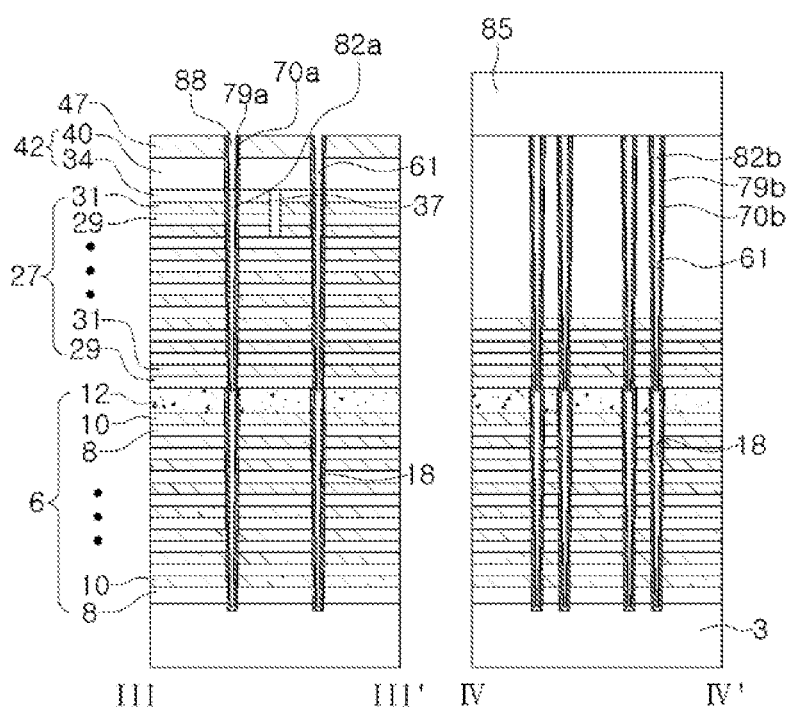

Referring to FIG. 1 and FIGS. 10A and 10B, a mask pattern 85 may be formed to cover the second preliminary vertical structure 67b and to expose the first preliminary vertical structure 67a among the preliminary vertical structures 67. The mask pattern 85 may be a photoresist pattern.

A portion of the first core pattern 82a in the first preliminary vertical structure 67a may be etched to form a recessed region 88. In an implementation, the first core pattern 82a in the first preliminary vertical structure 67a may be recessed from an upper surface of the first mask layer 47 to a position between an upper surface and a lower surface of the first capping pattern 42.

Figure 11A:
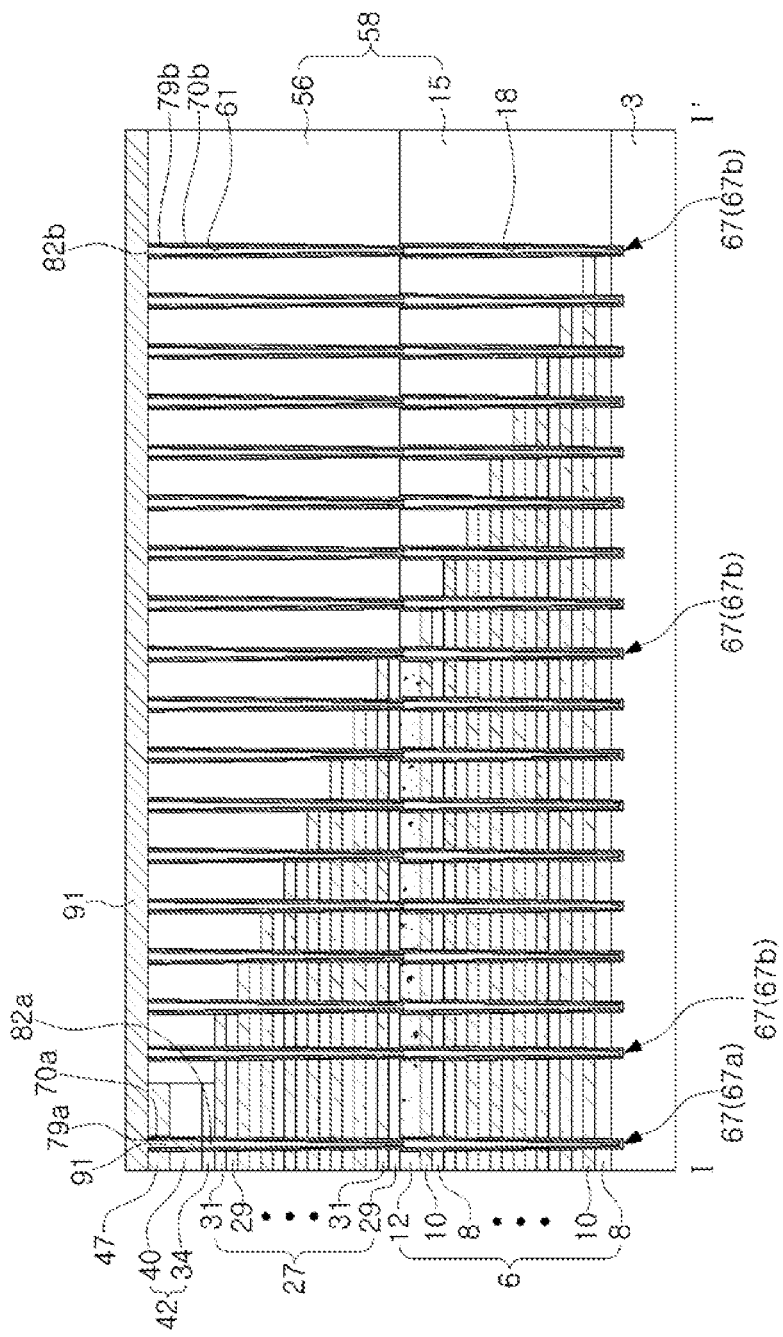
Figure 11B:
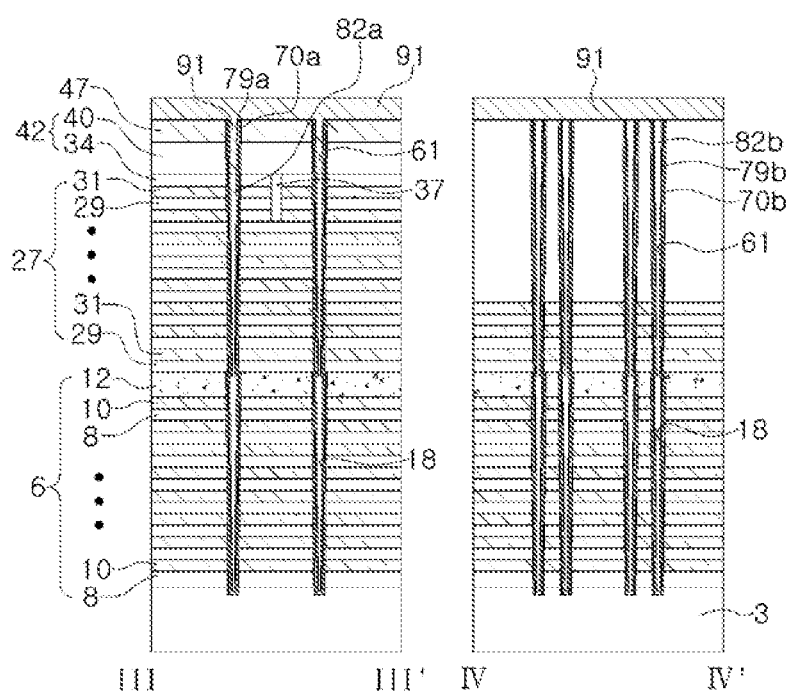

Referring to FIG. 1 and FIGS. 11A and 11B, the mask pattern (85 of FIGS. 10A and 10B) may be removed.

A pad material layer 91 may be formed to fill the recessed region 88 in the first preliminary vertical structure 67a and to cover the first mask layer 47 and the second upper capping layer 56. The pad material layer 91 may be formed of polysilicon.

Figure 12A:
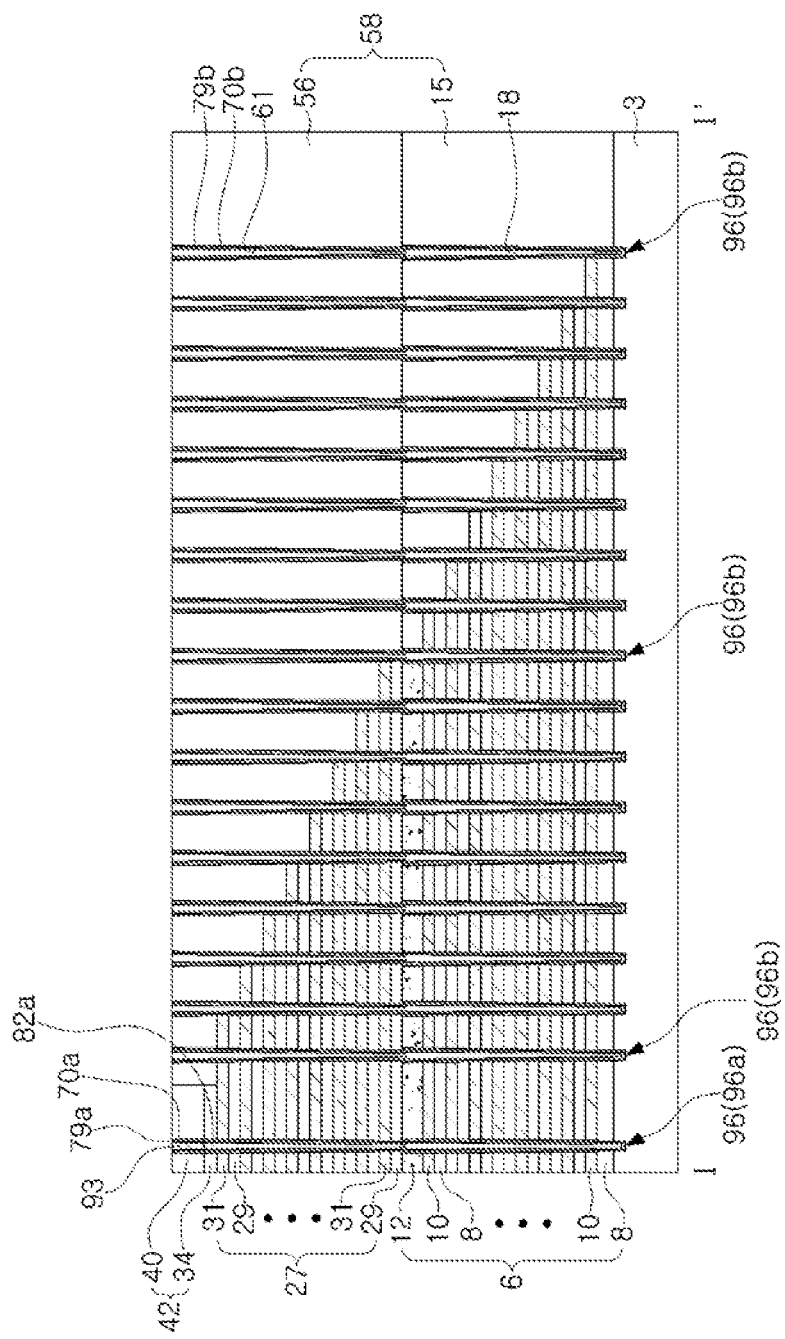
Figure 12B:
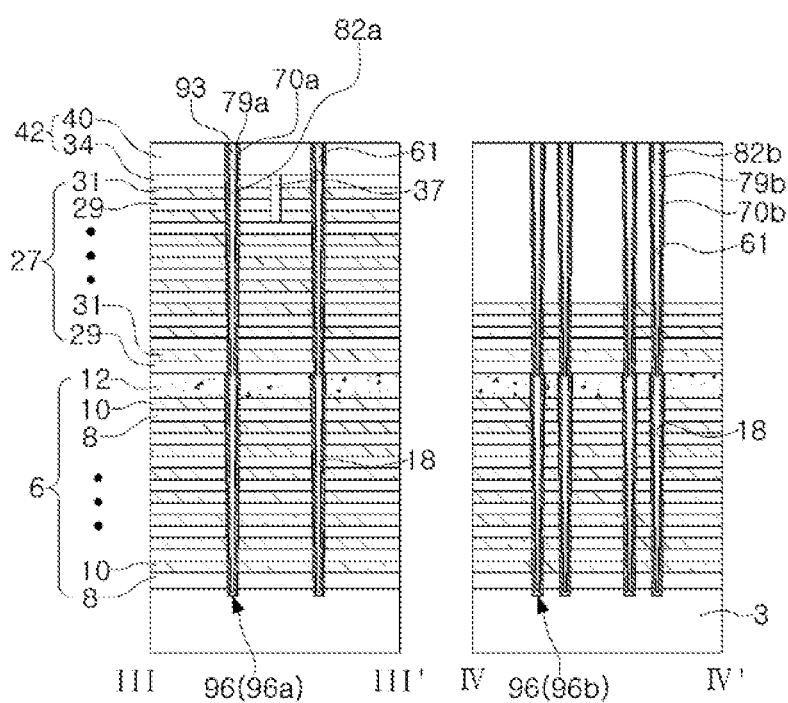

Referring to FIG. 1 and FIGS. 12A and 12B, a pad pattern 93 may be formed to be defined in the recessed region 88 in the first preliminary vertical structure 67a while planarizing the pad material layer 91. The preliminary vertical structures 67 may be formed as vertical structures 96 having a reduced height.

The first preliminary vertical structure 67a may be formed as a first vertical structure 96a including the pad pattern 93. The first mask layer 47 may be removed while forming the pad pattern 93, and the second upper capping layer 56 of the second capping pattern 58 may be formed to have an upper surface coplanar with an upper surface of the first capping pattern 42.

The second preliminary vertical structure 67b may be formed as a second vertical structure 96b while forming the pad pattern 93. The second vertical structure 96b may have upper surfaces substantially coplanar with an upper surface of the first vertical structure 96a. In an implementation, the first vertical structure 96a and the second vertical structure 96b may be formed to have the same structure as described with reference to FIG. 3.

Figure 13A:
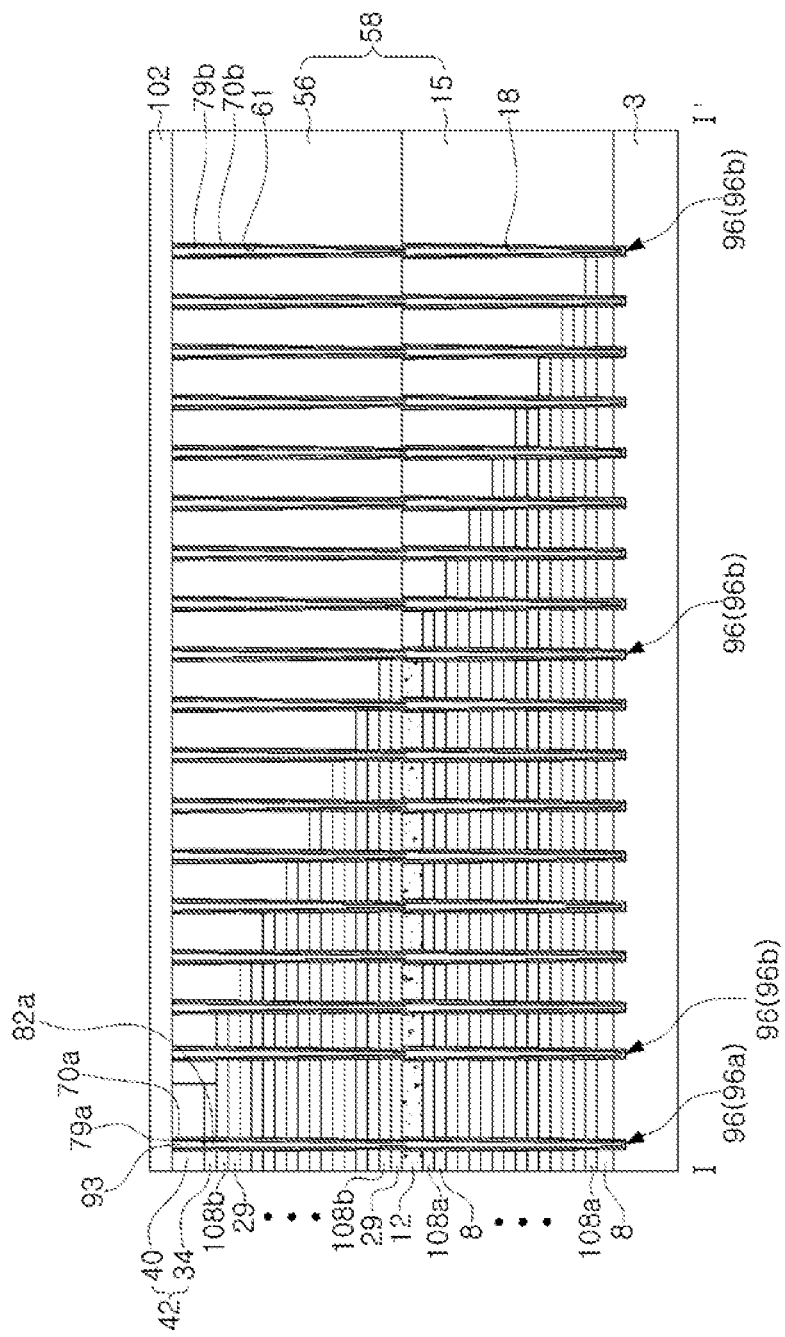
Figure 13B:
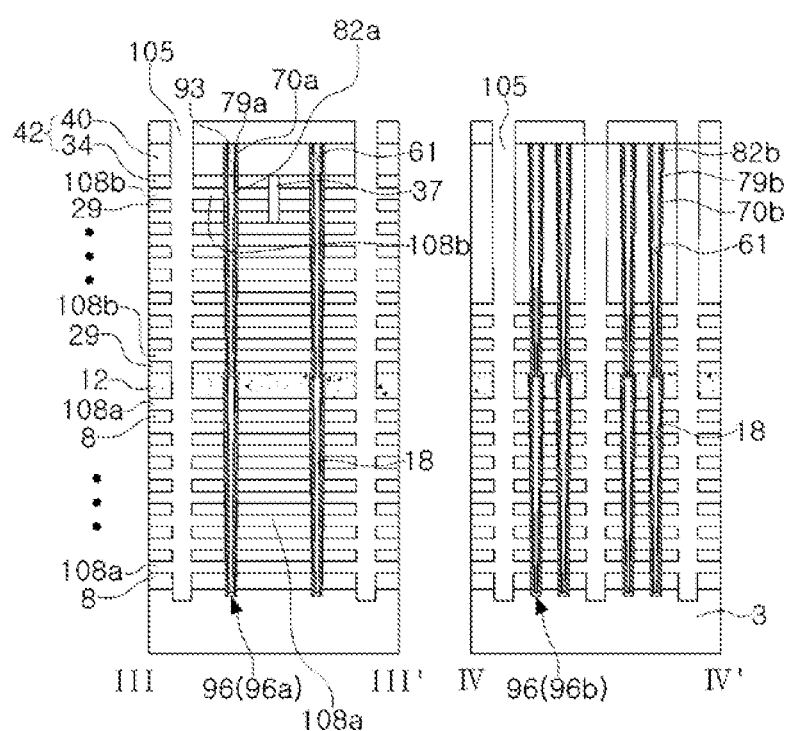

Referring to FIG. 1 and FIGS. 13A and 13B, a first upper insulating layer 102 may be formed on the capping structures 42 and 58. The first upper insulating layer 102 may be in contact with the upper surface of the first vertical structure 96a and the upper surface of the second vertical structure 96b.

Separation trenches 105 may be formed to penetrate through the first upper insulating layer 102, the capping structures 42 and 58, the first mold structure 6, and the second mold structure 27.

The separation trenches 105 may expose the first preliminary gate layers 10 and the second preliminary gate layers 31.

Then, the first preliminary gate layers 10 and the second preliminary gate layers 31 may be removed such that empty spaces 108a and 108b are formed to expose side surfaces of the vertical structures 96. The empty spaces 108a and 108b may include first empty spaces 108a, formed by removing the first preliminary gate layers 10, and second empty spaces 108b formed by removing the first preliminary gate layers 10.

Returning to FIGS. 1, 2A, 2B, and 2C, first gate layers 112g1 may be formed to fill the first empty spaces 108a, formed by removing the first preliminary gate layers 10, and second gate layers 112g2 may be formed to fill the second empty spaces 108b formed by removing the first preliminary gate layers 10. The first gate layers 112g1 and the second gate layers 112g2 may be simultaneously formed.

Separation structures 118 may be formed to fill the separation trenches 105. A second upper insulating layer 121 may be formed on the first upper insulating layer 102. Gate contact plugs 124 may be formed to penetrate through the second upper insulating layer 121, the first upper insulating layer 102, and the second capping pattern 58 and to be electrically connected to the first gate pad regions 112p1 of the first gate layers 112g1 and second gate pad regions 112p2 of the second gate layers 112g2.

A third upper insulating layer 127 may be formed on the second upper insulating layer 121.

A bit line contact plug 130 may be formed to penetrate through the third upper insulating layer 127, the second upper insulating layer 121, and the first upper insulating layer 102 and to be electrically connected to the pad pattern 93. Upper contact plugs 133 may be formed to penetrate through the third upper insulating layer 127 and to be electrically connected to the gate contact plugs 124. A bit line 136 may be formed on the third upper insulating layer 127 to be electrically connected to the bit line contact plug 130. Gate interconnections 139 may be formed on the third upper insulating layer 127 to be electrically connected to the upper contact plugs 133.

As described above, example embodiment may provide a method of forming a semiconductor device using an annealing process to discharge gases in material layers which may be formed of a silicon oxide. Such an annealing process may be used to prevent defects of a semiconductor device which could otherwise be caused by the gases in the material layers which may be formed of a silicon oxide. In addition, such an annealing process may help prevent or significantly reduce occurrence of defects even when the material layers, which may be formed of a silicon oxide, decrease in thickness. As a result, integration density of the semiconductor device may be improved.

One or more embodiments may provide a semiconductor device, capable of improving integration density, and a method of forming the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first substrate;
a stack structure on the first substrate and including a first stack group and a second stack group on the first stack group, the first stack group and the second stack group each including interlayer insulating layers and gate layers alternately stacked in a vertical direction, the vertical direction being perpendicular to an upper surface of the first substrate, the gate layers being stacked on a first region in the vertical direction and extending from the first region in a second direction, the second direction being parallel to the upper surface of the first substrate, and the gate layers including pad regions arranged in a stepped shape on a second region adjacent to the first region;
a capping insulating layer on the stack structure on the first region and the second region;
a first vertical structure penetrating through the capping insulating layer and the stack structure on the first region;
a second vertical structure penetrating the capping insulating layer and the stack structure on the second region;
a third vertical structure penetrating the capping insulating layer and the stack structure on the second region;
an upper insulating layer on the capping layer; and
a contact plug penetrating through the upper insulating layer and contacting the first vertical structure,
wherein the first vertical structure includes a first core pattern, a first semiconductor layer on a side surface of the first core pattern, and a pad pattern on an upper surface of the first core pattern and contacting the first semiconductor layer,
wherein each of the second vertical structure and the third vertical structure includes a second core pattern and a second semiconductor layer on a side surface of the second core pattern, and
wherein an upper surface of the second core pattern is at a higher level than an upper surface of the first core pattern.

2. The semiconductor device as claimed in claim 1, wherein the first vertical structure includes a first vertical region penetrating through the first stack group, a second vertical region penetrating through the second stack group, and a first junction region between the first vertical region and the second vertical region.

3. The semiconductor device as claimed in claim 2, wherein:
the first vertical region has a first side surface adjacent to the second vertical region,
the second vertical region has a second side surface adjacent to the first vertical region,
the first junction region has a surface extending from the first and second side surfaces, and a first slope of the surface of the first junction region is different from a second slope of each of the first and second side surfaces.

4. The semiconductor device as claimed in claim 3, wherein the second slope of each of the first and second side surfaces is steeper than the first slope of the surface of the first junction region.

5. The semiconductor device as claimed in claim 2, wherein a first width of an upper region of the first vertical region adjacent to the second vertical region is different from a second width of a lower region of the second vertical region adjacent to the first vertical region.

6. The semiconductor device as claimed in claim 5, wherein the first width of an upper region of the first vertical region adjacent to the second vertical region is greater than a second width of a lower region of the second vertical region adjacent to the first vertical region.

7. The semiconductor device as claimed in claim 2, wherein:
the second vertical structure penetrates through the first stack group and the second stack group of the stack structure, and
the third vertical structure penetrates through the first stack group of the stack structure and is spaced apart from the first stack group.

8. The semiconductor device as claimed in claim 7, wherein each of the second and third vertical structure includes a fourth vertical region at the same level as the first vertical region, a fifth vertical region at the same level as the second vertical region, and a second junction region at the same level as the first junction region.

9. The semiconductor device as claimed in claim 8, wherein:
the fourth vertical region has a first side surface adjacent to the fifth vertical region,
the fifth vertical region has a second side surface adjacent to the fourth vertical region,
the second junction region has a surface extending from the first and second side surfaces, and
a first slope of the surface of the first junction region is different from a second slope of each of the first and second side surfaces.

10. The semiconductor device as claimed in claim 1, wherein:
the first core pattern extends continuously from a first height level to a second height level,
the first height level is at a lower level than a lowermost gate layer among the gate layers, and
the second height level is at a higher level than an uppermost gate layer among the gate layers.

11. The semiconductor device as claimed in claim 10, wherein the first and second semiconductor layers continuously extend from the first height level to the second height level.

12. The semiconductor device as claimed in claim 1, further comprising:
a second substrate; and
a peripheral circuit region on the second substrate,
wherein the first substrate is on the peripheral circuit region.

13. The semiconductor device as claimed in claim 12, further comprising:
a first horizontal pattern on the first substrate; and
a second horizontal pattern on the second horizontal pattern,
wherein:
the first vertical structure penetrates through the first and second horizontal patterns and contacts the first substrate,
the first horizontal pattern contacts the first semiconductor layer, and
the second horizontal pattern is spaced apart from the first semiconductor layer.

14. The semiconductor device as claimed in claim 13, wherein each of the first and second horizontal patterns include a doped polysilicon.

15. The semiconductor device as claimed in claim 1, wherein:
the first vertical structure further includes a data storage layer on an external surface of the first semiconductor layer,
the data storage layer extends continuously from a first height level to a second height level,
the first height level is at a lower level than a lowermost gate layer among the gate layers, and
the second height level is at a higher level than an uppermost gate layer among the gate layers.

16. The semiconductor device as claimed in claim 1, wherein:
the first vertical structure further includes data storage patterns between the first semiconductor layer and the gate layers, and
the data storage patterns are spaced apart from each other in the vertical direction.

17. The semiconductor device as claimed in claim 1, wherein an upper surface of the pad pattern is at the same level as an upper surface of the second semiconductor layer.

18. A semiconductor device, comprising:
a lower substrate;
a peripheral circuit region on the lower substrate;
a stack structure on the peripheral circuit region, the stack structure including interlayer insulating layers and gate layers alternately stacked in a vertical direction, the vertical direction being perpendicular to an upper surface of the first substrate, the gate layers being stacked on a first region in the vertical direction and extending from the first region in a second direction, the second direction being parallel to the upper surface of the first substrate, and the gate layers including pad regions arranged in a stepped shape on a second region adjacent to the first region;
a horizontal pattern between the stack structure and the peripheral circuit region;
a capping insulating layer on the stack structure on the first region and the second region;
a first vertical structure penetrating through the capping insulating layer and the stack structure on the first region;
a second vertical structure penetrating the capping insulating layer and the stack structure on the second region;
an upper insulating layer on the capping layer; and
a contact plug penetrating through the upper insulating layer and contacting the first vertical structure,
wherein:
the first vertical structure includes a first core pattern, a first semiconductor layer on the side surface of the first core pattern, and a pad pattern on an upper surface of the first core pattern and contacting the first semiconductor layer,
the second vertical structure includes a second core pattern and a second semiconductor layer on the side surface of the second core pattern, the first semiconductor layer contacts the horizontal pattern, and the upper insulating layer is spaced apart from the first core pattern and contacts the second core pattern.

19. The semiconductor device as claimed in claim 18, wherein:

the horizontal pattern contacts the first semiconductor layer, the first semiconductor layer extends continuously from a first height level to a second height level, the first height level is at a lower level than a lowermost gate layer among the gate layers, and the second height level is at a higher level than an uppermost gate layer among the gate layers.

20. The semiconductor device as claimed in claim 18, further comprising an upper substrate between the horizontal pattern and the peripheral circuit region, wherein:

the upper substrate includes a conductive material, horizontal pattern includes a doped polysilicon, and the upper substrate contacts the horizontal pattern.

* * * * *

UNITED STATES PATENT AND TRADEMARK OFFICE
CERTIFICATE OF CORRECTION

PATENT NO. : 11,626,413 B2
APPLICATION NO. : 17/749486
DATED : April 11, 2023
INVENTOR(S) : Junhyoung Kim and Jisung Cheon It is certified that error appears in the above-identified patent and that said Letters Patent is hereby corrected as shown below:

In the Claims

Claim 1:
On Line 10, replace "on a first region in the vertical direction" with "on a first region of the stack structure in the vertical direction"
On Line 14, replace "arranged in a stepped shape on as second region adjacent" with "arranged in a stepped shape on a second region of the stack structure adjacent"
On Lines 16-17, replace "a capping insulating layer on the stack structure on the first region and the second region" with "a capping insulating layer on the first region and the second region of the stack structure"
On Lines 18-20, replace "a first vertical structure penetrating through the capping insulating layer and the stack structure on the first region" with "a first vertical structure penetrating through the capping insulating layer and the first region of the stack structure"
On Lines 21-23, replace "a second vertical structure penetrating the capping insulating layer and the stack structure on the second region" with "a second vertical structure penetrating the capping insulating layer and the second region of the stack structure"
On Lines 24-25, replace "a third vertical structure penetrating the capping insulating layer and the stack structure on the second region" with "a third vertical structure penetrating the capping insulating layer and the second region of the stack structure"
On Line 26, replace "an upper insulating layer on the capping layer" with "an upper insulating layer on the capping insulating layer"
On Line 39, replace "an upper surface" with "the upper surface"

Claim 6:
On Line 2, replace "an upper region" with "the upper region"
On Line 4, replace "a second width of a lower region" with "the second width of the lower region"

Claim 8:
On Line 2, replace "each of the second and third vertical structure" with "each of the second vertical structure and the third vertical structure"

Signed and Sealed this
Twentieth Day of May, 2025

Coke Morgan Stewart
*Acting Director of the United States Patent and Trademark Office*

CERTIFICATE OF CORRECTION (continued)
U.S. Pat. No. 11,626,413 B2

Claim 13:
On Lines 4-5, replace "a second horizontal pattern on the second horizontal pattern" with "a second horizontal pattern on the first horizontal pattern"

Claim 18:
On Line 8, replace "first substrate" with "lower substrate"
On Line 9, replace "on a first region in the vertical direction" with "on a first region of the stack structure in the vertical direction"
On Lines 11-12, replace "of the first substrate" with "of the lower substrate"
On Line 13, replace "arranged in a stepped shape on a second region adjacent" to "arranged in a stepped shape on a second region of the stack structure adjacent"
On Lines 17-18, replace "a capping insulating layer on the stack structure on the first region and the second region" with "a capping insulating layer on the first region and the second region of the stack structure"
On Lines 19-21, replace "a first vertical structure penetrating through the capping insulating layer and the stack structure on the first region" with "a first vertical structure penetrating through the capping insulating layer and the first region of the stack structure"
On Lines 22-24, replace "a second vertical structure penetrating the capping insulating layer and the stack structure on the second region" with "a second vertical structure penetrating the capping insulating layer and the second region of the stack structure"
On Line 25, replace "the capping layer" with "the capping insulating layer"
On Line 30, replace "the side" with "a side"
On Line 35, replace "the side" with "a side"

Claim 20:
On Line 5, replace "horizontal pattern" with "the horizontal pattern"